United States Patent
Takagi et al.

(10) Patent No.: US 6,737,684 B1
(45) Date of Patent: May 18, 2004

(54) BIPOLAR TRANSISTOR AND SEMICONDUCTOR DEVICE

(75) Inventors: Takeshi Takagi, Kyoto (JP); Kenji Harafuji, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 298 days.

(21) Appl. No.: 09/659,484

(22) Filed: Sep. 11, 2000

Related U.S. Application Data

(62) Division of application No. 09/252,908, filed on Feb. 19, 1999.

(30) Foreign Application Priority Data

| Feb. 20, 1998 | (JP) | 10-038758 |
|---|---|---|
| Jun. 3, 1998 | (JP) | 10-154689 |
| Jun. 3, 1998 | (JP) | 10-154700 |

(51) Int. Cl.$^7$ ......... H01L 31/0328
(52) U.S. Cl. ......... 257/194; 257/11; 257/12; 257/15; 257/24; 257/183; 257/191; 257/200
(58) Field of Search ......... 257/11–15, 24, 257/183, 191, 192, 194, 200

(56) References Cited

U.S. PATENT DOCUMENTS

| 5,246,316 A | | 9/1993 | Mohammad | |
|---|---|---|---|---|
| 5,389,798 A | | 2/1995 | Ochi et al. | |
| 5,426,316 A | | 6/1995 | Mohammad | |
| 5,440,152 A | * | 8/1995 | Yamazaki | 257/197 |
| 5,719,415 A | * | 2/1998 | Yagura et al. | 257/191 |
| 5,798,539 A | * | 8/1998 | Jorke | 257/197 |
| 6,031,256 A | * | 2/2000 | Liu et al. | 257/198 |

FOREIGN PATENT DOCUMENTS

| GB | 2 260 858 | 4/1993 |
|---|---|---|
| GB | 2 288 691 | 10/1995 |
| JP | 61-272969 | 12/1986 |
| JP | 64-009656 | 1/1989 |
| JP | 01-231371 | 9/1989 |
| JP | 03-198344 | 8/1991 |
| JP | 4-273491 | 9/1992 |
| JP | 05-121677 | 5/1993 |
| JP | 5-259440 | 10/1993 |
| JP | 5-275717 | 10/1993 |
| JP | 6-204457 | 7/1994 |
| JP | 6-66519 | 8/1994 |
| JP | 6-260493 | 9/1994 |
| JP | 07-193081 | 7/1995 |
| JP | 08-181151 | 7/1996 |
| JP | 08-293505 | 11/1996 |
| JP | 09-283533 | 10/1997 |

OTHER PUBLICATIONS

S.M. Sze, Physics of Semiconductor Device, 1981, John Wiley & Sons, $2^{nd}$ Edition, P. 850.*

(List continued on next page.)

Primary Examiner—Long Pham
Assistant Examiner—Wai-Sing Louie
(74) Attorney, Agent, or Firm—Nixon Peabody LLP; Donald R. Studebaker

(57) ABSTRACT

There is provided a MQB layer as a multi-quantum barrier portion composed of well layers and barrier layers that are formed of extremely thin films having different compositions and alternately stacked. This enhances an effective barrier height by using the phenomenon that holes likely to flow from a SiGe base layer to a Si emitter layer are reflected by the MQB layer and thereby suppresses the reverse injection of the holes from the SiGe base layer into the Si emitter layer. As a result, the reverse injection of carriers is suppressed by the MQB layer even when the base doping concentration is increased, which provides a satisfactory current amplification factor and increases a maximum oscillation frequency. What results is a bipolar transistor having excellent RF characteristics such as current amplification factor, current gain cutoff frequency, and maximum oscillation frequency in a microwave band or the like.

10 Claims, 14 Drawing Sheets

OTHER PUBLICATIONS

Notice of Reasons of Rejection, patent application No. 10-154689 Mailing Date: Jun. 4, 2002, with Mailing No. 172502.

Notice of Reasons of Rejection, patent application No. 10-154689 Mailing Date: Oct. 2, 2001, Mailing No. 2033500001, with English Translation.

Notice of Reasons of Rejection, patent application No. 10-154700 Mailing Date: Oct. 2, 2001, Mailing No. 2033500007, with English Translation.

J.S. Yuan, "Switch–Off Transient Analysis for Heterojunction Bipolar Transistors in Saturation", Solid–State Electronics, vol. 36, No. 9, pp. 1261–1266, 1993.

M. Ugajin et al., "The Base–Collector Heterojunction Effect in SiGe–Base bipolar Transistors", Solid–State Electronics, vol. 34. No. 6, pp. 593–598, 1991.

M. Karlsteen et al., "Improved Switch Time of $I^2L$ at Low Power Consumption by Using a SiGe Heterojunction Bipolar Transistor", Solid–State Electronics, vol. 38, No. 7, pp. 1401–1407, 1995.

S.P. Wainwright et al., "A Stored Charge Model for Integrated Injection Logic ($I^2L$) Structures Using Si/SiGe Material", Proc. of European Solid State Device Research Conference, pp. 649–652, 1996.

K.W. Goossen et al., "Planarization of Emitter–Base Structure of Heterojunction Bipolar Transistors by Doping Selective Base Contact and Nonalloyed Emitter Contact", IEEE Transactions on Electron Devices, vol. 38, No. 11, Nov. 1, 1999, pp. 2423–2426.

D.L. Harame et al., "Optimization of Sige HBT Technology for High Speed Analog and Mixed–Signal Applications", Proceedings of the International Electron Devices Meeting, Washington, Dec. 5–8, 1993, Dec. 5, 1993, pp. 71–74, XP000481571, Institute of Electrical Electronics Engineer.

European Search Report dated Oct. 8, 1999.

* cited by examiner

Si/SiGe(x=0.2)  ΔEv=150meV
Si/SiGe(x=0.3)  ΔEv=225meV
Si/SiGe(x=0.4)  ΔEv=300meV

CARRIER CONCENTRATION IN δ
DOPED Si LAYER (cm$^{-3}$)

BIPOLAR TRANSISTOR AND SEMICONDUCTOR DEVICE

This application is a Divisional of application Ser. No. 09/252,908, filed Feb. 19, 1999.

BACKGROUND OF THE INVENTION

The present invention relates to a semiconductor device having a heterojunction portion such as a bipolar transistor, a diode, or an $I^2L$.

Because of its excellent RF characteristics, a bipolar transistor has conventionally been used as an active device operable in the microwave/milliwave bands. In particular, most vigorous research and development has been directed to a heterojunction bipolar transistor (HBT) using a III-V compound semiconductor such as GaAs. In recent years, attention has been focused on a HBT using a SiGe material, which is a IV-IV compound material that can be fabricated on a low-cost silicon substrate.

The following are the two representative types of structures for implementing higher-speed SiGe HBTs. One of the two types is a HBT reported in Document 1 (L. Harame et al., "Optimization of SiGe HBT Technology for High Speed Analog and Mixed-Signal Applications," IEDM Tech. Dig. 1993, p.71), which comprises a Si collector layer, a SiGe base layer, and a Si emitter layer. In the SiGe base layer, a Ge composition ratio is increased gradually from a region in contact with the Si emitter layer toward a region in contact with the Si collector layer to provide a graded composition base layer. The other of the two types is a HBT reported in Document 2 (A. Schuppen et al., "Enhanced SiGe Heterojunction Bipolar Transistors with 160 GHz-fmax," IEDM Tech. Dig. 1995, p.743.), which comprises a Si collector layer, a SiGe base layer, and a Si emitter layer. The SiGe base layer has an extremely reduced thickness, an increased Ge composition ratio, and an increased doping concentration to provide a uniform composition base layer.

FIG. 18 is a band diagram of the former heterojunction bipolar transistor having the graded composition base layer. As can be seen from the band state shown in the drawing, an electric field induced by the graded composition causes carriers injected into the SiGe base layer to drift in the SiGe base layer toward the collector layer. Since the traveling of the carriers caused by the drift electric field is at a higher speed than the traveling thereof caused by diffusion, a base transit time is reduced and excellent RF characteristics are obtained.

FIG. 19 is a band diagram of the latter heterojunction bipolar transistor having the uniform composition base structure. As can be seen from the band state shown in the drawing, the base layer is extremely thinned to reduce the base transit time and provide excellent RF characteristics. In this case, the thinning of the base layer incurs the risk of increasing the base resistance, so that the base layer is doped with a high-concentration impurity to lower the base resistance. In addition, SiGe having a high Ge composition ratio is used in the base layer to prevent reverse injection of carriers from the base layer doped with the high-concentration impurity into the emitter, so that a heterojunction barrier formed between the SiGe base layer and the Si emitter layer is increased. In this case also, excellent RF characteristics are obtained. In particular, the doping concentration in the base layer is increased to reduce the base resistance and thereby increase a maximum oscillation frequency.

In a conventional Si LSI using a bipolar transistor, on the other hand, it has frequently been performed to compose a diode by using a PN junction portion between the base and collector of the NPN bipolar transistor and use the diode as an element of a logic circuit. This is because the NPN bipolar transistor has a structure suitable for the formation of a large number of built-in diodes since the PN junction portion between the base and collector has a high breakdown voltage (with respect to a reverse bias) and the N-type collector layer is used as a common region in the substrate.

However, such a PN junction diode has the drawback that it is unsuitable for use in a device operating at a high speed due to minority carriers accumulated in each of the P-type and N-type regions thereof. Specifically, electrons as minority carriers are accumulated in the P-type base layer of the NPN bipolar transistor layer, while holes as minority carriers are accumulated in the N-type collector layer thereof. In a typical high-speed bipolar transistor, the P-type base layer is formed extremely thin to reduce the base transit time so that the accumulation of the electrons in the P-type base layer presents substantially no problem even in the PN junction diode composed by using a part of the bipolar transistor. However, the N-type collector layer is formed to have a sufficient thickness in the range of 0.5 to 1 μm in order to retain a high breakdown voltage, so that numerous holes are accumulated therein, which eventually limits the speed of the PN junction diode.

As a method of increasing the operating speed by suppressing the accumulation of minority carriers in such a collector region, there has been known one reported in Document 3 (M. Ugajin et al., "The base-collector heterojunction effect in SiGe-base bipolar transistors," Solid-State Electron., vol.34, pp.593, 1991), in which a SiGe/Si heterojunction is provided in the base/collector junction to impart a wider band gap to the collector layer. By thus imparting the wider band gap to the collector layer, a heterojunction barrier is formed in the base/collector junction portion to suppress injection of holes from the base layer to the collector layer, thereby reducing the amount of holes accumulated in the collector and increasing the operating speed of the diode.

There has also been known a method disclosed in Document 4 (M. Karlsteen et al., "Improved switch time of I2L at low power consumption by using a SiGe heterojunction bipolar transistor," Solid-State Electron., vol.38, pp.1401, 1995), in which a heterojunction is provided in a base/collector junction portion in an $I^2L$ (Integrated Injection Logic) circuit into which a plurality of bipolar transistors have been integrated, thereby suppressing the accumulation of minority carriers and increasing the operating speed.

However, the aforesaid bipolar transistor and the diode using the bipolar transistor have the following disadvantages.

In the conventional HBT using the graded composition base shown in FIG. 18, it is required to greatly vary the Ge composition ratio in order to increase the intensity of the drift electric field induced by the graded composition. In short, it is required to minimize the Ge composition ratio in a region of the base layer in contact with the emitter layer and maximize the Ge composition ratio in a region of the base layer in contact with the collector layer. To satisfy the requirement, the region of the base layer in contact with the emitter layer normally has a pure Si composition without containing Ge, so that the base/emitter PN junction forms a silicon/silicon homojunction. In increasing the maximum oscillation frequency fmax of the HBT, it is effective to reduce the. base resistance as represented by the following equation (1). If a base doping concentration is increased to reduce the base resistance, however, an increased number of holes are naturally injected from the base layer into the emitter layer.

In the case where the emitter/base junction forms a homojunction or where the emitter/base junction forms a heterojunction but has a nearly pure Si composition at the end of the base, the quantity of carriers reversely injected into the emitter is increased because the base layer has no heterojunction barrier at all or, if any, an extremely low heterojunction barrier, so that the current amplification factor β is not increased.

$$f_{max} = \sqrt{\frac{f_T}{8\pi \cdot R_B \cdot C_{BC}}} \quad (1)$$

$f_r$: current gain cutoff frequency
$R_B$: base resistance
$C_{BC}$: base/collector junction capacitance The fact that the current amplification factor β is not increased can also be derived from the relationship represented by the following equation (2), which is established among the current amplification factor β, the band discontinuity value ΔEv of a valence band at the emitter/base junction portion, and a carrier concentration $N_B$ in the base layer.

$$\beta = \frac{J_n}{J_p} = \left(\frac{N_E}{N_B}\right) \cdot \left(\frac{V_n}{V_p}\right) \cdot \exp\left(\frac{\Delta E_v}{kT}\right) \quad (2)$$

$N_E$: carrier concentration in emitter layer
$N_B$: carrier concentration in base layer
$V_n$: speed of electron diffusion in base layer
$V_p$: speed of hole diffusion in emitter layer
k: Boltzmann's constant
T: absolute temperature.

In the case of using such a graded composition base, it becomes therefore possible to reduce the base transit time of carriers and improve the current gain cutoff frequency $f_T$. However, the increase of the maximum oscillation frequency fmax cannot eventually be expected since the concentration of carriers in the base layer cannot be increased.

On the other hand, the conventional structure using the uniform composition base shown in FIG. 19 can suppress reverse injection of carriers from the base layer because a high heterojunction barrier is formed between the SiGe base layer having a high Ge composition ratio and a Si emitter layer. If the concentration of carriers in the SiGe base layer (base doping concentration) is to be further increased in order to increase the maximum oscillation frequency fmax, as described above, the quantity of carriers reversely injected is increased. To prevent this, it is required to further enhance the height of the heterojunction barrier by further increasing the Ge composition ratio in the SiGe base layer, which increases the difference in lattice constant between the emitter layer and the base layer. As a result, a critical film thickness at which a dislocation occurs in the base layer presents a problem.

It is generally known that a lattice strain develops in a SiGe layer formed by crystal growth on a Si substrate due to the difference in lattice constant between Si and Ge, which is released if the Ge composition ratio is high and the film thickness is large and thereby causes a dislocation in the film as well as a fatal damage to the element. The film thickness at which a dislocation occurs is generally termed the critical film thickness. The critical film thickness is smaller as the Ge composition ratio in the SiGe layer is higher. The critical film thickness is on the order of 50 nm when the Ge composition ratio is 30%, which corresponds to the film thickness of the base layer.

Even when the film thickness of the SiGe layer is equal to or smaller than the critical film thickness, the SiGe layer is not in a completely stable state but in a quasi-stable state if the Ge composition ratio is high. If a high-temperature process is performed in a subsequent step, such a defect as dislocation is easily caused. Hence, it is inappropriate in terms of device reliability and a thermal budget during a device fabrication process to use a SiGe layer having a high Ge composition ratio.

Therefore, there is a limit to the improvement of the RF characteristics of a bipolar transistor which is accomplished by providing a heterojunction in the emitter/base junction and enhancing the function of suppressing reverse injection of carriers from the base into the emitter through the formation of a heterojunction.

On the other hand, there is a limit to the increase of the operating speed of a conventional device such as a bipolar transistor or diode reported in Document 3 or 4 which is accomplished by providing a heterojunction in the base/collector junction, suppressing injection of minority carriers from the base layer into the collector layer, and thereby reducing the accumulated carriers.

The reason for this is that, as reported in Document 3, a considerably high heterojunction barrier is required to reduce the quantity of holes accumulated in the N-type Si collector layer of a Si/SiGe HBT to the order of the quantity of electrons accumulated in the P-type SiGe base layer thereof. Specifically, a heterojunction barrier of a height of the order of 0.2 eV is required. To form such a heterojunction barrier at the base/collector junction composed of a SiGe/Si multiple layer, the Ge composition ratio in the base layer should be at least 25% or higher.

However, since the thickness of the base layer is preferably reduced to a value equal to or smaller than the critical film thickness and device reliability and the thermal budget during the device fabrication process should be ensured, as described above, a Ge composition ratio in the SiGe layer which is 25% or higher is excessively high in terms of reliability and manufacturability.

Hence, it is problematic to increase the Ge composition ratio in the SiGe layer in order to increase the height of a heterojunction barrier formed at the base/collector heterojunction.

SUMMARY OF THE INVENTION

A first object of the present invention is to provide a bipolar transistor wherein a current amplification factor is increased with the provision of a region having the function of suppressing reverse injection of carriers from the base layer into the emitter layer irrespective of a barrier formed at the emitter/base junction. In the bipolar transistor, the current amplification factor can be improved even when a base doping concentration is increased to increase the maximum oscillation frequency fmax by relaxing restrictions on the increase of the current amplification factor.

A second object of the present invention is to provide an element functioning as a bipolar transistor, a diode, an I²L element, or the like which operates at a high speed by suppressing the injection of minority carriers from the base layer into the collector layer and thereby reducing the quantity of minority carriers accumulated in the collector layer. This can be achieved by providing means for effectively increasing a heterojunction barrier formed at the base/collector junction without increasing the Ge composition ratio in the SiGe base layer to such a value as to excessively reduce the critical film thickness, i.e., by implementing a structure which ensures sufficiently high reliability.

To attain the first object, a first bipolar transistor according to the present invention has a multi-quantum barrier (MQB) composed of a superlattice structure consisting of two types of extremely thin films having different compositions and alternately stacked, which is provided in a region of the emitter adjacent the emitter/base junction. The MQB reflects a wave of carriers reversely injected from the base, which fact is used to effectively increase the height of a hetero-junction barrier (barrier height) and thereby suppress the reverse injection of the carriers from the base layer. Specifically, the first bipolar transistor has the following structure.

The first bipolar transistor according to the present invention comprises an emitter layer, a base layer, and a collector layer, the bipolar transistor having a multi-quantum barrier portion being provided in the emitter layer and composed of a plurality of barrier layers and well layers alternately stacked to perform the function of reflecting an incident wave of minority carriers in the emitter layer injected from the base layer and provide such a phase that the incident wave of carriers and a reflected wave of carriers intensify each other.

With the arrangement, not only a barrier induced by the discontinued valence band at the emitter/base junction but also the reflecting function of the multi-quantum barrier portion prevents reverse injection of carriers from the base layer. Since the reverse injection of carriers is suppressed, it becomes possible to increase the current amplification factor and improve RF characteristics including maximum oscillation frequency fmax even if the carrier concentration in the base layer is increased.

By composing the barrier layers and well layers of the multi-quantum barrier portion of respective semiconductor materials having different band gaps, there can easily be implemented a multi-quantum barrier layer having the function of suppressing reverse injection of carriers.

By setting the band discontinuity value of a band in the emitter layer containing the multi-quantum barrier portion, through which majority carriers flow, at a substantially negligible value, there is provided a band structure presenting no obstacle to the movement of majority carriers in the emitter layer, which enhances the effect of improving a current amplification factor.

With the base layer being strained, a particularly high effect is achieved when the difference in lattice constant between the emitter layer and the base layer is large.

By composing the emitter layer and the base layer of respective semiconductor materials having different band gaps and providing, in a band gap between a valence band and a conduction band in the base layer, a portion gradually decreasing from a region of the base layer in contact with the emitter layer toward a region of the base layer in contact with the collector layer, the traveling speed of carriers in the base layer is determined by a drift velocity, not by a diffusion speed, so that the base transit time is reduced and a current gain cut-off frequency fT is increased. In addition, the multi-quantum barrier portion. suppresses reverse junction of carriers from the base layer into the emitter layer irrespective of the band discontinuity value reduced by the provision of the graded composition base. Moreover, there can also be achieved a reduced base resistance attributable to higher-concentration base doping or an increased thickness of the base layer, which increases a maximum oscillation frequency fmax.

By composing the multi-quantum barrier portion of a superlattice structure of a $Si_{1-x-y}Ge_xC_y$/Si multiple layer, the critical film thickness of the $Si_{1-x-y}Ge_xC_y$ layer at the multi-quantum barrier portion is particularly increased, so that it becomes possible to further increase the effective barrier height of the multi-quantum barrier portion without incurring a dislocation.

With the multi-quantum barrier portion being disposed in a region of the emitter layer exterior to a depletion region formed between the emitter layer and the base layer at a working voltage when the transistor is operating, the function of suppressing reverse injection of carriers from the base into the emitter can maximally be performed in any operating condition.

By disposing the barrier layer at the end of the multi-quantum barrier portion closer to the base layer in such a position as to prevent the tunneling of the carriers from the depletion region formed between the emitter layer and the base layer to the well layer adjacent to the barrier layer at the end of the multi-quantum barrier portion closer to the base layer, such improved RF characteristics as described above can be expected without degrading the function of suppressing reverse injection of carriers performed by the multi-quantum barrier portion.

To attain the first object, a second bipolar according to the present invention has a high-concentration doped layer for effectively enhancing the function of suppressing reverse injection of carriers from the base layer into the emitter layer, which is provided in the emitter layer of the bipolar transistor. Specifically, the second bipolar has the following structure.

The second bipolar transistor according to the present invention comprises an emitter layer containing an impurity of a first conductivity type, a base layer containing an impurity of a second conductivity type, and a collector layer containing the impurity of the first conductivity type, the bipolar transistor having a high-concentration doped layer being provided in the emitter layer and doped with the impurity of the first conductivity type at a higher concentration than in the emitter layer.

This produces not only a barrier induced by a discontinued valence band at the emitter/base junction but also a potential barrier induced by a high-concentration doped layer in the valence band of the emitter layer, so that the carriers in the base layer are inhibited from being reversely injected into the emitter layer. By suppressing reverse injection of carriers, therefore, it becomes possible to improve the current amplification factor as well as the RF characteristics including maximum oscillation frequency fmax even if the carrier concentration in the base layer is increased.

Preferably, the high-concentration doped layer is a δ-doped layer having a thickness of 10 nm or less.

Preferably, the concentration of carriers of the first conductivity type in the high-concentration doped layer is $1 \times 10^{19}$ $cm^{-3}$ or more.

Preferably, the concentration of carriers of the first conductivity type in the high-concentration doped layer is more than ten times higher than the concentration of the carriers of the first conductivity type in the emitter layer.

With the high-concentration doped layer being adjacent to a depletion region formed at an emitter/base junction portion, there can maximally be performed the function of suppressing reverse injection of carriers from the base to the emitter.

Preferably, the concentration of carriers of the second conductivity type in the base layer is higher than the concentration of carriers of the first conductivity type in the emitter layer.

By composing the emitter layer and the base layer of two types of semiconductor materials having different band gaps, imparting the wider band gap to the semiconductor material composing the emitter layer, and providing a heterojunction portion between the emitter layer and the base layer, the function of suppressing reverse injection of carriers from the base layer is further enhanced by using a high barrier at the heterojunction portion. In that case, the strained base layer achieves a particularly high effect when the difference in lattice constant between the emitter layer and the base layer is large.

To attain the second object, a semiconductor device according to the present invention has a multi-quantum barrier (MQB) having a superlattice structure consisting of two types of extremely thin films having different compositions and alternately stacked, which is provided in a region of the collector layer in contact with the collector/base junction. The height of the heterojunction barrier (barrier height) has been effectively increased by using the effect of reflecting a wave of carriers injected from the base (minority carriers in the collector layer). Specifically, the semiconductor device has the following structure.

The semiconductor device according to the present invention comprises a bipolar transistor comprises an emitter layer, a base layer, and a collector layer, the bipolar transistor having a multi-quantum barrier portion being provided in the collector layer and composed of a plurality of barrier layers and well layers alternately stacked to perform the function of reflecting an incident wave of minority carriers in the collector layer injected from the base layer (minority carriers in the collector layer) and provide such a phase that the incident wave and a reflected wave intensify each other.

In the arrangement, the carriers in the base layer are prevented from being injected into the collector layer not only by a barrier induced by a discontinued valance band at the collector/base junction but also by the reflecting function performed by the multi-quantum barrier portion. By suppressing the injection of minority carriers, therefore, the accumulation of the minority carriers in the collector layer is prevented and the operating speed of a bipolar transistor or the like is increased even if the carrier concentration in the base layer is increased.

The semiconductor device can also comprise an additional structure similar to the structure of the first bipolar.

By further providing the semiconductor device with an element having, as components, two regions having the same structure as a base/collector junction of the bipolar transistor, there can be obtained an element operating at a high speed by using the function of suppressing injection of minority carriers performed by the multi-quantum barrier portion. The element is, e.g., a diode.

By further providing the semiconductor device with another bipolar transistor comprising a collector layer disposed in a region used commonly by the base layer of the bipolar transistor, a base layer disposed in a region used commonly by the collector layer of the bipolar transistor, and an emitter layer, the semiconductor device is caused to function as an I²L element occupying a smaller area and operating at a high speed.

In that case, it is also possible to provide at least one other collector layer connected to the base layer of the bipolar transistor and another multi-quantum barrier portion being disposed in the one other collector layer and composed of a plurality of barrier layers and well layers alternately stacked to perform the function of reflecting an incident wave of carriers injected from the base layer (minority carriers in the collector layer) and provide such a phase that the incident wave and a reflected wave intensify each other.

DETAILED DESCRIPTION OF THE INVENTION

EMBODIMENT 1

The present embodiment relates to a heterojunction bipolar transistor having a multi-quantum barrier composed of a superlattice structure consisting of two types of extremely thin films having different compositions and alternately stacked, which is provided in a region of the emitter adjacent the emitter/base junction.

Figure 1:
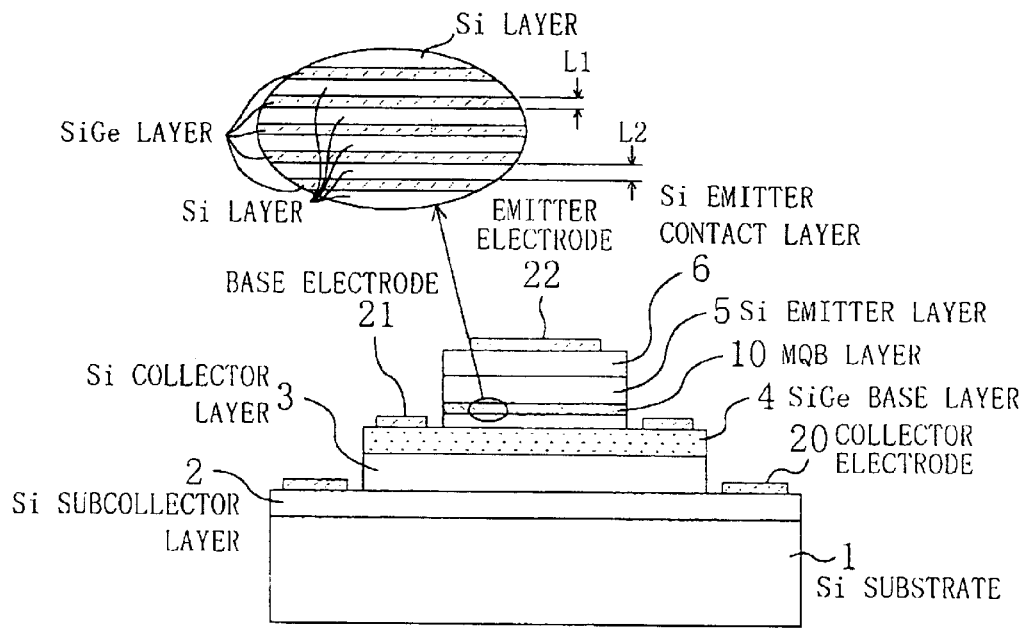
FIG. 1 is a cross-sectional view of an NPN heterojunction bipolar transistor according to a first embodiment, in which a MQB layer as a Si/SiGe multi-quantum barrier portion is provided in the emitter layer.

FIG. 1 is a cross-sectional view showing a structure of an NPN heterojunction bipolar transistor having a multi-quantum barrier composed of a Si/SiGe superlattice provided in the emitter layer according to the present embodiment. As shown in the drawing, there are provided: a high-concentration n-type Si subcollector layer 2 doped with arsenic; an n-type Si collector layer 3 doped with arsenic; a high-concentration p-type SiGe base layer 4 doped with boron; an n-type Si emitter layer 5 doped with arsenic; and a high-concentration n-type Si emitter contact layer 6 doped with arsenic that have been stacked sequentially on a Si substrate 1. A collector electrode 20, a base electrode 21, and an emitter electrode 22 are disposed on the Si subcollector layer 2, the SiGe base layer 4, and the Si emitter contact layer 6, respectively.

The thickness of the high-concentration n-type Si subcollector layer 2 is approximately 500 nm and the concentration of arsenic (n-type impurity) in the Si subcollector 2 is approximately $2 \times 10^{19}$ cm$^{-3}$. The thickness of the n-type Si collector layer 3 is approximately 650 nm and the concentration of arsenic in the Si collector layer 3 is approximately $1 \times 10^{17}$ cm$^{-3}$. The thickness of the high-concentration p-type SiGe base layer 4 is approximately 50 nm and the concentration of boron (p-type impurity) in the SiGe base layer 4 is approximately $1 \times 10^{19}$ cm$^{-3}$. The thickness of the n-type Si emitter layer 5 is approximately 100 nm and the concentration of arsenic in the Si emitter layer 5 is approximately $2 \times 10^{18}$ cm$^{-3}$. The thickness of the high-concentration n-type Si emitter contact layer 6 is approximately 50 nm and the concentration of arsenic in the Si emitter contact layer 6 is approximately $2 \times 10^{19}$ cm$^{-3}$. These layers have been stacked sequentially by MBE.

A MQB layer 10 as a multi-quantum barrier portion having a superlattice structure composed of extremely thin Si and SiGe layers that have been alternately stacked is provided in a region of the Si emitter layer 5 adjacent the emitter/base junction portion. The MQB layer 10 has such a structure that the compositions and film thicknesses thereof have been adjusted to reflect a wave of holes reversely injected from the SiGe base layer 4 into the Si emitter layer 5 and provide a phase in which the incident wave of holes and a reflected wave of holes intensify each other. Specifically, the MQB layer 10 has a multilayer structure consisting of well layers 10a each composed of a SiGe layer with a thickness of L1 and barrier layers 10b each composed of a Si layer with a thickness of L2. The respective thicknesses and compositions of the well layers 10a and barrier layers 10b are determined to satisfy the relationship represented by the following equation (3).

$$\left. \begin{array}{l} \frac{\sqrt{2m_1 * E}}{h} \cdot L_1 = \frac{2m-1}{4} \\ \frac{\sqrt{2m_2 * (E - \Delta Ev)}}{h} \cdot L_2 = \frac{2n-1}{4} \end{array} \right\} \quad (3)$$

m1*: effective mass of holes in SiGe layer (well layer)
m2*: effective mass of holes in Si layer (barrier layer)
L1: thickness of SiGe layer (well layer)
L2: thickness of Si layer (barrier layer)
E: energy of incident holes
ΔEv: valence band discontinuity value at Si/SiGe heterojunction
h: Planck's constant
m, n: integers Specifically, the MQB layer 10 according to the present embodiment is composed of a superlattice layer consisting of five pairs of the barrier layers 10b each formed of Si having a thickness of 1.4 nm and the well layers 10a each formed of $Si_{0.7}Ge_{0.3}$ having a thickness of 1.4 nm. In this case, the MQB increases an effective barrier height by approximately 150 meV.

On the other hand, the SiGe base layer 4 has a graded composition base structure in which a Ge composition ratio increases substantially continually from 0% to 20% from a region in contact with the Si emitter layer 5 toward a region in contact with the Si collector layer 3.

Figure 2:
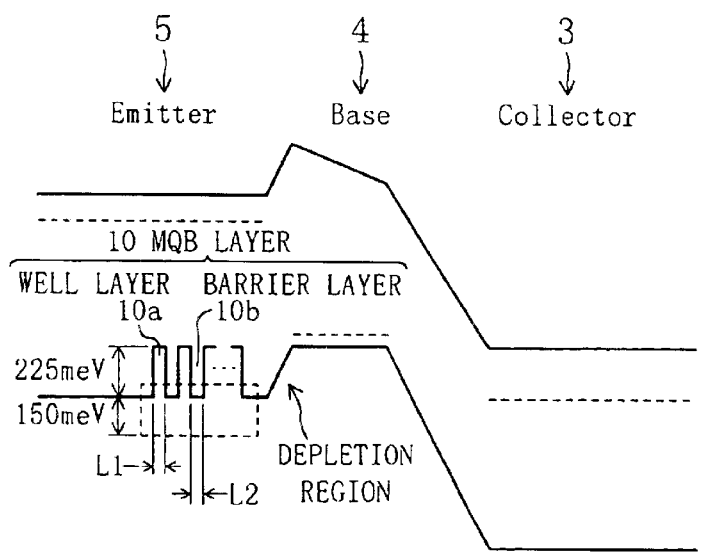
FIG. 2 is a band diagram of the NPN heterojunction bipolar transistor according to the first embodiment, in which the MQB layer as the Si/SiGe multi-quantum barrier portion is provided in the emitter layer.

FIG. 2 is a band diagram of the NPN heterojunction bipolar transistor having the multi-quantum barrier layer composed of the Si/SiGe superlattice and provided in the Si emitter layer 5 according to the present embodiment. As shown in the drawing, the multi-quantum barrier (MQB) layer 10 consisting of the five pairs of Si barrier layers 10b and $Si_{0.7}Ge_{0.3}$ well layers 10a is provided in the region of the Si emitter layer 5 adjacent the emitter/base junction. A potential barrier indicated by the broken lines in FIG. 2 is formed due to the existence of the MQB layer 10. The potential barrier operates to reflect holes likely to flow from the SiGe base layer 4 into the Si emitter layer 5, which has enhanced the effective barrier height sensed by the holes likely to flow from the SiGe base layer 4 by approximately 150 meV. The enhanced effective barrier height suppresses reverse injection of the holes into the Si emitter layer 5 even when a hole concentration in the SiGe base layer 4 is increased and thereby provides a sufficient current gain. As a result, there can be implemented a HBT having an extremely high maximum oscillation frequency fmax.

Figure 3:
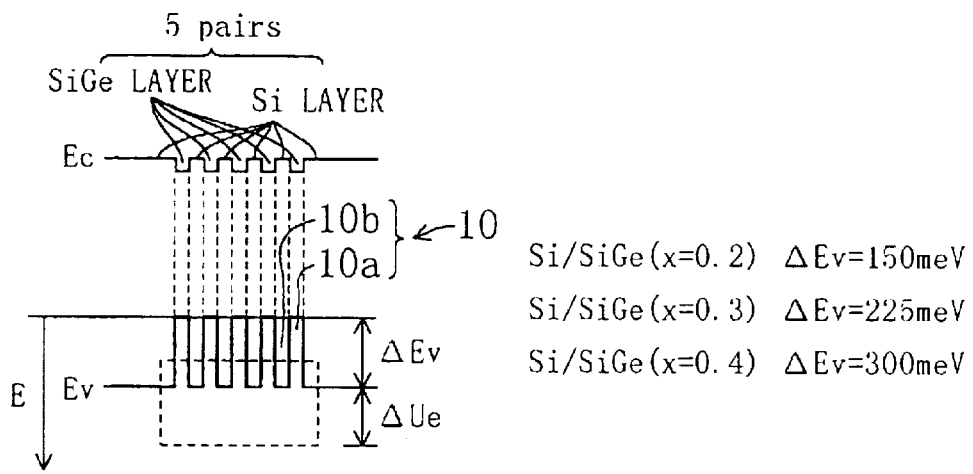
FIG. 3 is a band diagram showing a model for calculating a barrier height $\Delta U_e$ enhanced by the MQB layer in the transistor.

FIG. 3 shows a model for calculating a barrier height ΔUe enhanced by the MQB layer 10 according to the present invention. The enhanced barrier height ΔUe in each of the five pairs of Si/SiGe superlattice structures composing the MQB layer 10 was calculated for the three structures of $Si/Si_{0.8}Ge_{0.2}$, $Si/Si_{0.7}Ge_{0.3}$, and $Si/Si_{0.6}Ge_{0.4}$. At this time, the respective band discontinuity values ΔEv of the valence bands at the individual heterojunctions between the well layers 10a and the barrier layers 10b are 150 meV, 225 meV, and 300 meV. As shown in FIG. 3, the difference in energy level between the lower end of the potential barrier (see the broken lines in FIG. 3) formed due to the existence of the MQB layer 10 and the valence band corresponds to the barrier height ΔUe enhanced by the MQB layer 10.

Although the energy level Ec of a conduction band in the whole emitter layer 5 including the MOB layer 10 is shown substantially flat in FIG. 3, to be more precise, the energy level of the conduction band actually lowers slightly in the portions of the SiGe layers of the MOB layer 10 compared with the energy level of the conduction band in the Si layer. However, the band discontinuity value in the whole Si emitter layer 5 including the MQB layer 10 may well be considered as substantially zero, since the lowering of the energy level is negligible.

Figure 4:
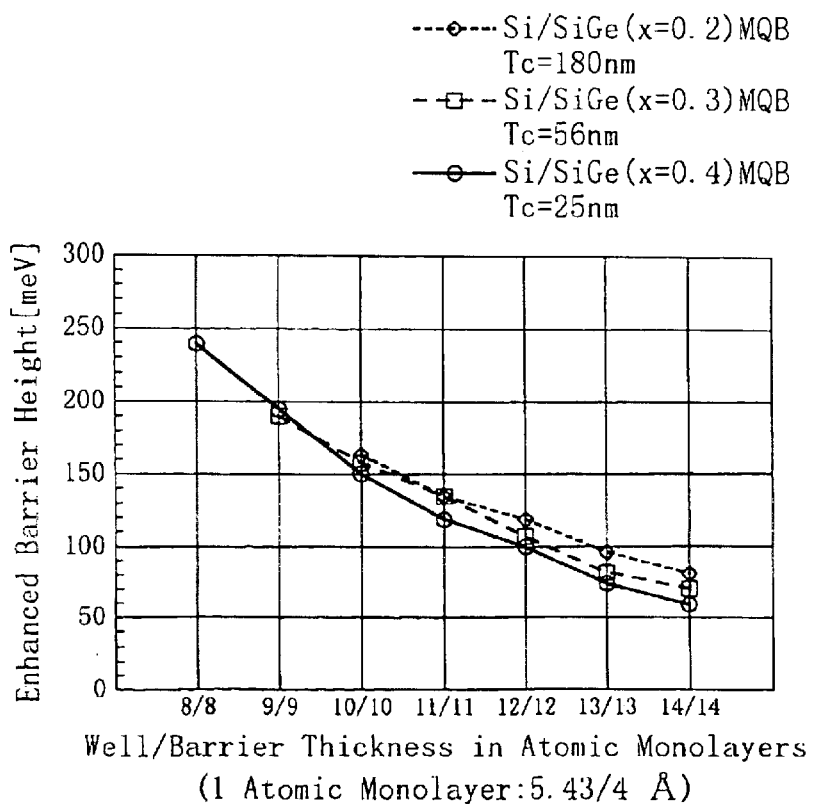
FIG. 4 shows the result of calculating the barrier height $\Delta U_e$ enhanced by the MQB layer.

FIG. 4 shows the result of calculating the barrier heights ΔUe enhanced by the MQB layer 10 by varying the number of the atomic monolayers of well layers 10a and barrier layers 10b. The calculations were performed by varying x to 0.2, 0.3, and 0.4 in $Si_{1-x}Ge_x$ representing SiGe composing the well layers 10a, i.e., for the three structures of $Si/Si_{0.8}Ge_{0.2}$, $Si/Si_{0.7}Ge_{0.3}$, and $Si/Si_{0.6}Ge_{0.4}$. In the drawing, the horizontal axis represents a well/barrier thickness expressed in the number of atomic monolayers (one atomic monolayer corresponds to (5.43/4)Å). As shown in the drawing, the enhanced barrier height ΔUe in the MQB layer 10 tends to decrease with an increase in the number of monolayers in any of the cases where x is varied to 0.2, 0.3, and 0.4. If the number of monolayers is excessively reduced, there may occur the case where the probability of holes passing through the MQB layer 10 becomes nonzero, though it is not shown in the drawing.

The maximum value of the enhanced barrier height ΔUe increases with an increase in Ge composition ratio to reach approximately 240 meV when each of Si and $Si_{0.6}Ge_{0.4}$ of $Si/Si_{0.6}Ge_{0.4}$ is composed of 8 atomic monolayers. When the effective barrier height in the MQB layer 10 is increased by about 240 meV, the function of suppressing reverse injection of holes from the SiGe base layer 4 into the Si emitter layer 5 is performed particularly remarkably.

Even if there are slight fluctuations in the film thicknesses and compositions of the MQB layer 10, the function of suppressing reverse injection of holes mentioned above will easily be performed provided that the effective barrier height ΔUe in the MQB layer 10 is on the order of 100 meV or more.

In order to enhance the barrier height ΔUe when SiGe is used in the well layers 10a of the MQB layer 10, it is necessary to further increase the Ge composition ratio in the well layers 10a. However, the increased Ge composition ratio may cause a dislocation depending on the critical film thickness of SiGe. The respective critical film thicknesses for $Si_{0.8}Ge_{0.2}$, $Si_{0.7}Ge_{0.3}$, and $Si_{0.6}Ge_{0.4}$ when the underlie is Si are approximately 180 nm, 56 nm, and 25 nm.

In increasing the critical film thickness, it is effective to use $Si_{1-x-y}Ge_xC_y$ and Si to compose the well layers 10a and barrier layers 10b of the MQB layer 10, respectively. By adjusting the Ge composition to 40% or more and adding a slight amount of C (on the order of several percentage) thereto, a strained lattice can be alleviated without greatly varying the magnitude of the band discontinuity value ΔEv at the emitter/base junction, which increases the critical film thickness of the well layer 10a. By thus composing the MQB layer 10a of $Si_{1-x-y}Ge_xC_y$, a larger band discontinuity value ΔEv can be obtained without exceeding the critical film thickness, which effectively suppresses reverse injection of holes from the SiGe base layer 4 into the emitter layer 5.

Next, a description will be given to the effect of improving the RF characteristics of the HBT in which the effective barrier height ΔUe has been enhanced with the provision of the MQB layer 10 in the Si emitter layer 5.

Figure 5:
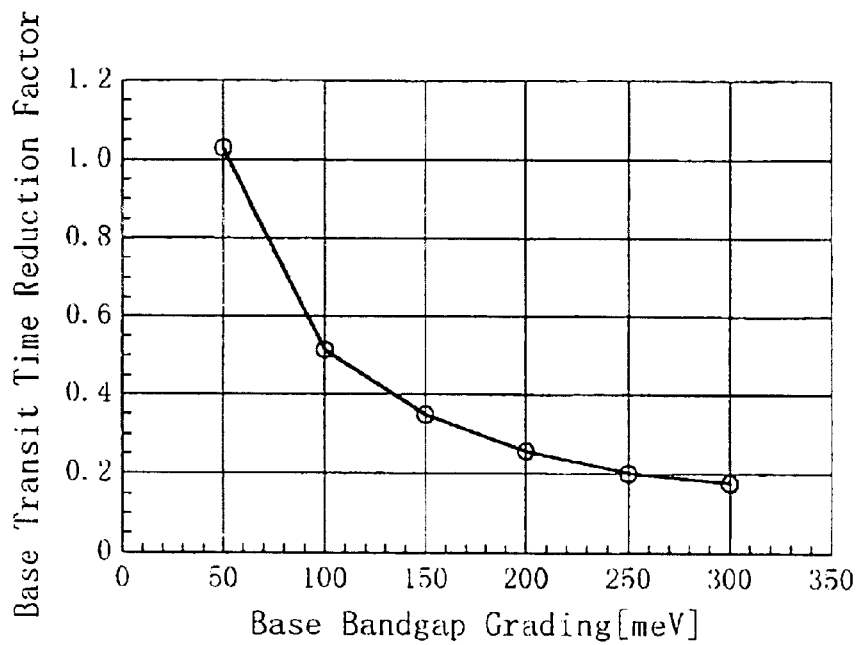
FIG. 5 shows the result of calculating the degree to which a base transit time has been reduced in the HBT of the present invention having the barrier height enhanced by the MQB layer and a graded composition base layer, compared with the base transit time in the conventional HBT having the uniform composition base layer.

FIG. 5 shows the result of calculating the degree to which the base transit time $\tau_B$ of carriers has been reduced (base transit time reduction factor) in the HBT in which the barrier height ΔUe has been enhanced by the MQB layer 10 and the Ge composition ratio in the SiGe base layer 4 has been graded as shown in FIG. 2, compared with the base transit time in the conventional HBT using the uniform composition base layer. As is represented by the following equations (4) and (5), the base transit time $\tau_B$ is a factor directly influencing the current gain cutoff frequency $f_T$, which is higher as the base transit time $\tau_B$ is shorter.

$$f_T = 1/(2\pi \cdot \tau_{EC}) \quad (4)$$

$$\tau_{EC} = \tau_E + \tau_{EB} + \tau_B + \tau_{BC} + \tau_C \quad (5)$$

where $\tau_{BC}$ is the emitter-to-collector transit time of carriers; $\tau_E$ is a time required for the accumulation of minority carriers reversely injected into the emitter; $\tau_{EB}$ is a charge/discharge time for $C_{EB}$; $\tau_{EB}$ is the transit time of majority carriers in the base; $\tau_B$ is a charge/discharge time for $C_{BC}$; and $\tau_C$ is the transit time of electrons in the collector.

In the case of using the uniform composition base layer, however, $\tau_B$ is determined by a diffusion speed as represented by the following equation (6).

$$\tau_B = W_B^2/(2k \cdot T\mu e/q) \quad (6)$$

where $W_B$ is the thickness of the base layer; $\mu e$ is the mobility of electrons; and T is a temperature.

In the case of using the graded composition base layer, on the other hand, $\tau_B$ is determined by a drift velocity as represented by the following equations (7) and (8).

$$\tau_B = W_B/(\mu e \cdot E) \quad (7)$$

$$E = \Delta E_{gr}/q \cdot W_B \quad (8)$$

As will be seen from FIG. 5, the base transit time is reduced in accordance with the gradient if a graded composition is imparted to the base layer having the same thickness as the conventional uniform composition base layer. When the gradient of the band gap is 300 meV in the graded composition, the base transit time is reduced to approximately 20% of the base transit time in the uniform composition base.

Figure 6:
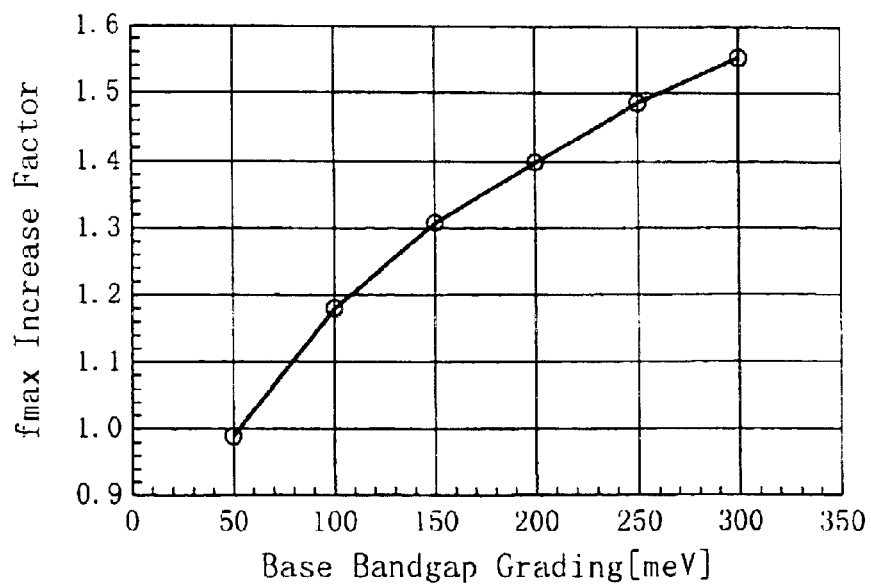
FIG. 6 shows the result of calculating the degree to which a maximum oscillation frequency fmax has been increased in the HBT of the first embodiment having the barrier height enhanced by the MQB layer and the graded composition base layer with an increased film thickness, compared with the conventional HBT having the graded composition base layer.

FIG. 6 shows the result of calculating the degree to which the maximum oscillation frequency fmax (fmax increase factor) has been increased in the HBT in which the barrier height ΔUe has been enhanced with the provision of the MQB layer 10 and the graded composition base layer having an increased thickness for a reduced base resistance $R_B$ is provided, compared with the maximum oscillation frequency fmax in the conventional HBT having the heavily doped uniform composition base layer. It is to be noted that the film thickness of the SiGe base layer has been adjusted to provide a base transit time equal to the base transit time in the heavily doped uniform composition base layer of the conventional HBT. Since the base transit time is reduced by using the graded composition base layer, as shown in the drawing, the thickness of the base layer can be increased as the base gap gradient resulting from the graded composition is increased. As a result, the base resistance $R_B$ is reduced and the maximum oscillation frequency fmax is increased. As shown in the drawing, the maximum oscillation frequency fmax when the band gap gradient resulting from the graded composition is 300 meV is more than 1.5 times higher than the maximum oscillation frequency in the uniform composition base.

In the HBT according to the present embodiment, therefore, the following effects can be derived from the RF characteristics shown in FIGS. 6 and 5.

First, the provision of the MQB layer 10 having the barrier height $\Delta Ue$ in the Si emitter layer 5 achieves the same effect as achieved when the band discontinuity value $\Delta Ev$ of the valence band at the emitter/base junction is substantially increased (see the equation (2)), resulting in an improved current amplification factor $\beta$. In other words, the provision of the MQB layer 10 for suppressing reverse injection of holes from the SiGe base layer 4 into the Si emitter layer 5 reduces the current Jp shown in the equation (2) flowing from the base to the emitter and thereby improves the current amplification factor $\beta$. The effect is achievable whether the emitter/base junction is a heterojunction or not. Consequently, the same effect can also be achieved in a normal bipolar transistor other than a HBT.

Second, since the graded composition has been imparted to the SiGe base layer 4 and the MQB layer 10 is provided in the Si emitter layer 5, the Ge composition ratio in the SiGe base layer 4 varies such that the band gap in the SiGe base layer 4 gradually decreases from the region of the SiGe base layer 4 in contact with the Si emitter layer 5 toward the region thereof in contact with the Si collector layer 3, whereby the current gain cutoff frequency $f_T$ is increased. As stated previously, if the base doping concentration is increased to lower the resistance of the uniform composition base layer in the conventional HBT, the quantity of holes reversely injected is increased so that a sufficient current gain is not obtained. By contrast, since the effective barrier height is enhanced with the provision of the MQB layer 10 in the HBT according to the present invention, the effective barrier height is held sufficiently large even when the band discontinuity value of the heterojunction at the emitter/base junction is reduced with the provision of the graded composition base and the base doping concentration is increased, which suppresses reverse injection of holes. Hence, there can be obtained the heavily doped base layer having a graded composition, which has conventionally been unobtainable. As a result, the base transit time of electrons is reduced and the RF characteristics are improved.

Third, since the base transit time is reduced by providing the graded composition base layer, the thickness of the base layer can be increased with the increasing band gap gradient resulting from the graded composition. As a result, the base resistance is reduced and the maximum oscillation frequency fmax is increased.

Fourth, a sufficient current gain obtainable with a low Ge composition ratio achieves the effect of suppressing the occurrence of a dislocation due to a thermal budget during the subsequent process step, which presents a problem when a high Ge composition ratio is used, i.e., the effect of increasing the thermal budget. Briefly, this achieves the effect of providing the device fabrication process with an increased margin as well as increased device reliability.

Figure 7A:
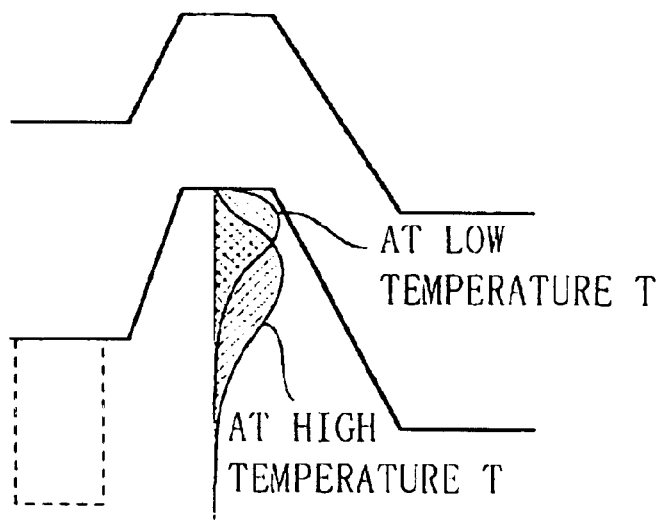
FIG. 7($a$) is a band diagram of the bipolar transistor of the first embodiment showing an improved temperature characteristic and FIG. 7($b$) is a graph plotted as a function of temperature against a current amplification factor.
Figure 7B:
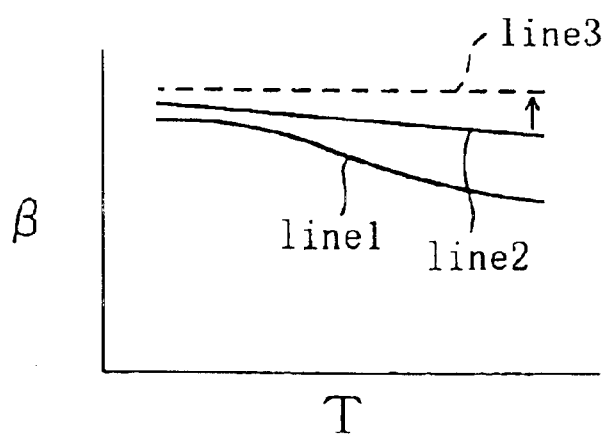

Fifth, the temperature characteristics of the bipolar transistor can also be improved. Specifically, since the distribution of hole concentrations in the valence band of the SiGe layer 4 shifts downwardly at an increased temperature, as shown in FIG. 7(a), the current amplification factor $\beta$ of the bipolar transistor exhibits a general tendency to lower as the temperature T increases, as represented by the lines 1 and 2. The tendency is particularly conspicuous when the band discontinuity value $\Delta Ev$ is low. By contrast, the bipolar transistor according to the present invention provides a high current amplification factor $\beta$ even at a high temperature owing to the function of suppressing reverse injection of holes performed by the MQB layer 10, as represented by the line 3 in FIG. 7(b).

Thus, by providing the MQB layer 10 in the region of the emitter layer 5 adjacent the emitter/base junction of the heterojunction bipolar transistor, the current gain and RF characteristics of the heterojunction bipolar transistor can be improved.

For the MQB layer 10 to reliably perform the barrier function, the whole MQB layer 10 is preferably disposed externally of a depletion region formed between the emitter and the base at a working voltage. This is because, if the MQB layer 10 has a part located within the depletion region, the function of suppressing reverse injection of holes may not be performed reliably with respect to the part.

In addition, the barrier layer 10b of the MQB layer 10 which is adjacent to the SiGe base layer 4 is preferably placed in such a position as to prevent the tunneling of holes from the depletion region to the well layer 10a which is adjacent to the barrier layer 10b, since the occurrence of the tunneling degrades the function of suppressing reverse injection of holes. Preferably, the MQB layer 10 in the Si emitter layer 5 is at a distance shorter than the diffusion length of holes from the SiGe base layer 4.

Although the present embodiment has described the improved characteristics of the heterojunction bipolar transistor as a single element, it will easily be appreciated that the HBT according to the present invention may also be used for the bipolar part of a BiCMOS device in which the bipolar transistor and a MOS transistor have been integrated.

Although the present embodiment has described the NPN SiGe HBT by way of example, it will easily be appreciated that the present invention is also applicable to a PNP bipolar transistor. Alternatively, the present invention may also be applied to a normal homojunction bipolar transistor other than the HBT and to a heterojunction bipolar transistor having a multi-level structure consisting of III-V compound semiconductor layers of GaAs, AlGaAs, and the like, as stated previously.

EMBODIMENT 2

The present embodiment relates to a heterojunction bipolar transistor characterized in that a heterojunction barrier height (barrier height) is effectively increased by providing, in a region of the emitter adjacent the emitter/base junction, a δ-doped layer having an extremely high carrier concentration to suppress reverse injection of carriers from the base layer and thereby improve the current gain and RF characteristics of the heterojunction bipolar transistor.

Figure 8:
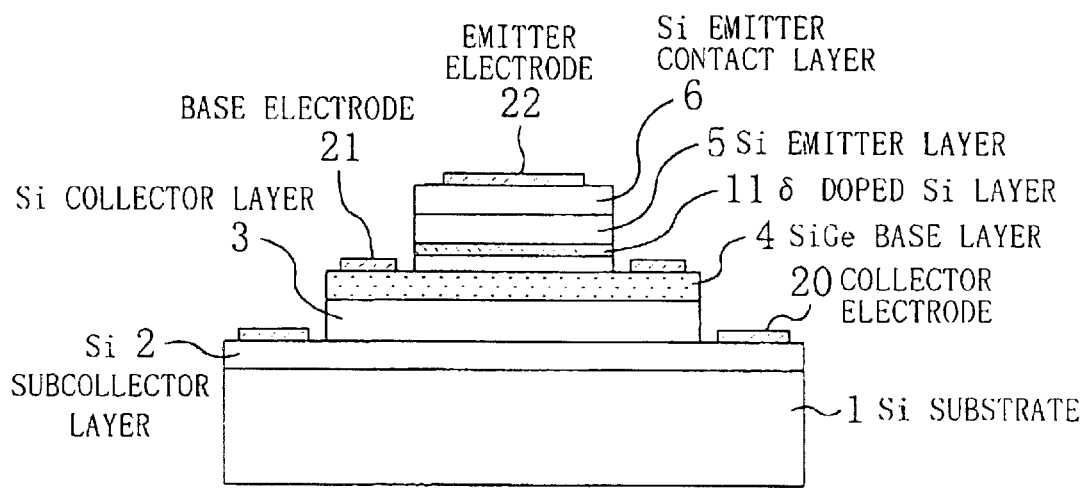
FIG. 8 is a cross-sectional view of an NPN heterojunction bipolar transistor according to a second embodiment, in which a β-doped Si layer is provided in the emitter layer.

FIG. 8 shows a structure of an NPN heterojunction bipolar transistor having the δ-doped layer provided in the emitter layer according to the present embodiment. As shown in the drawing, there are provided: a high-concentration n-type Si subcollector layer 2 doped with antimony; an n-type Si collector layer 3 doped with antimony; a high-concentration p-type SiGe base layer 4 doped with boron; an n-type Si emitter layer 5 doped with antimony; and a high-concentration n-type Si emitter contact layer 6 doped with antimony that have been stacked sequentially on a Si substrate 1 by MBE. A collector electrode 20, a base electrode 21, and an 20 emitter electrode 22 are disposed on the Si subcollector layer 2, the SiGe base layer 4, and the Si emitter contact layer 6, respectively.

The thickness of the high-concentration n-type Si subcollector layer 2 is approximately 500 nm and the concentration of antimony (n-type impurity) in the Si subcollector 2 is approximately $2\times10^{19}$ cm$^{-3}$. The thickness of the n-type Si collector layer 3 is approximately 650 nm and the concentration of antimony in the Si collector layer 3 is approximately $1\times10^{17}$ cm$^{-3}$. The thickness of the high-concentration p-type SiGe base layer 4 is approximately 50 nm and the concentration of boron (p-type impurity) in the SiGe base layer 4 is approximately $1\times10^{19}$ cm$^{-3}$. The thickness of the n-type Si emitter layer 5 is approximately 100 nm and the concentration of antimony in the Si emitter layer 5 is approximately $2\times10^{18}$ cm$^{31}$ $^3$. The thickness of the high-concentration n-type Si emitter contact layer 6 is approximately 50 nm and the concentration of antimony in the Si emitter contact layer 6 is approximately $2\times10^{19}$ cm$^{-3}$. These layers have been formed sequentially by MBE.

A δ-doped Si layer 11 heavily doped with an n-type impurity is provided in a region of the n-type emitter layer 5 adjacent the emitter/base junction portion. The thickness of the δ-doped Si layer 11 is approximately 5 nm and the impurity concentration therein is approximately $1\times10^{20}$ cm$^{-3}$. The δ-doped Si layer 11 is disposed in the region of the emitter at a distance of approximately 40 nm from the emitter/base junction portion. Antimony is used as the n-type dopant. The SiGe base layer 4 has a graded composition base structure in which a Ge composition ratio increases substantially continually in the range of 0% to 30% from a region in contact with the Si emitter layer 5 toward a region in contact with the Si collector layer 3.

Figure 9:
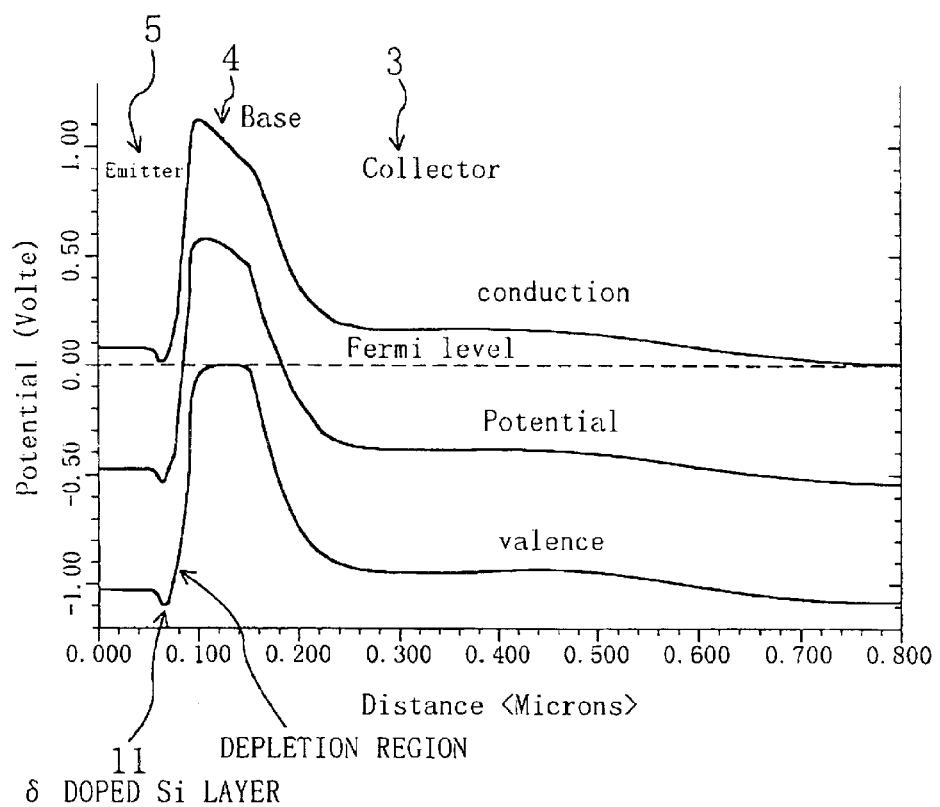
FIG. 9 is a cross-sectional view of the NPN heterojunction bipolar transistor according to the second embodiment, in which the δ-doped Si layer is provided in the emitter layer.
Figure 10:
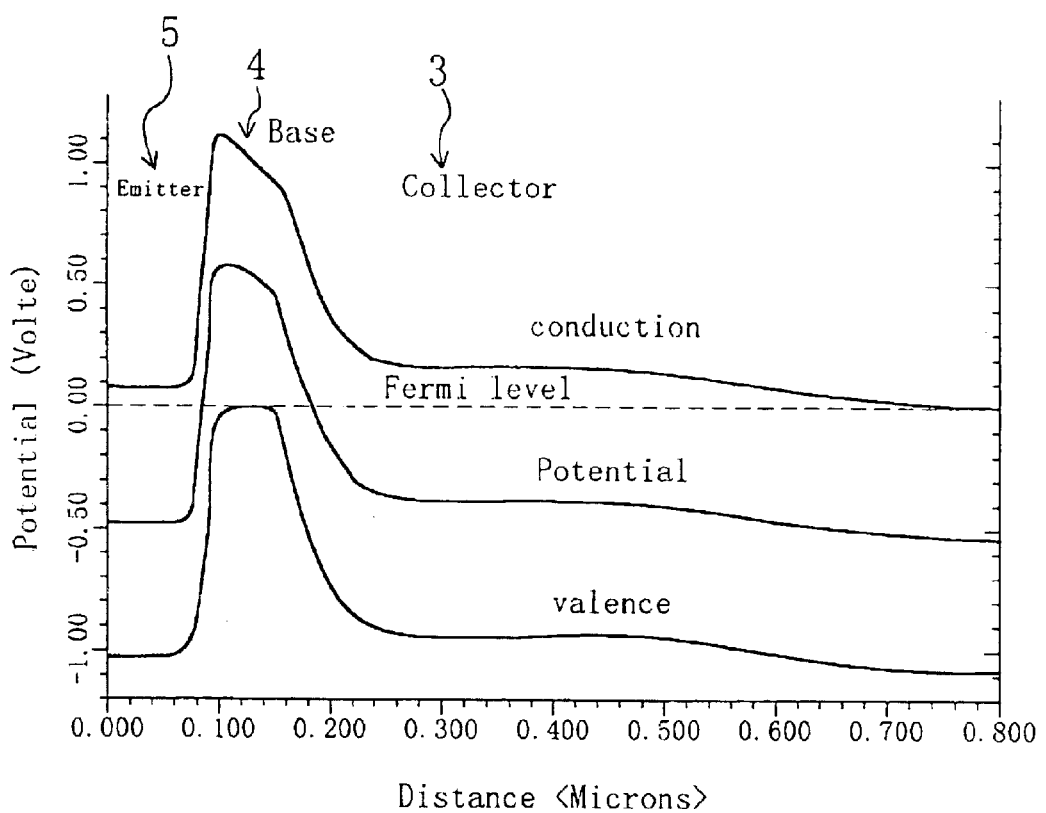
FIG. 10 is a band diagram of an NPN heterojunction bipolar transistor in which the δ-doped Si layer is not provided in the emitter layer.

FIG. 9 is a band diagram of the NPN heterojunction bipolar transistor according to the present embodiment, in which the δ-doped Si layer is provided in the emitter layer. FIG. 10 is a band diagram of the conventional NPN heterojunction bipolar transistor, in which the δ-doped Si layer is not provided in the Si emitter layer.

As can be seen from FIGS. 9 and 10, when the δ-doped Si layer 11 heavily doped with an n-type impurity is provided in the region of the emitter adjacent the emitter/base junction, the band is modulated by the δ-doped Si layer 11 and a potential barrier against holes is formed. From the viewpoint of holes in the SiGe base layer 4, the provision of the δ-doped Si layer 11 has increased an effective barrier height. Consequently, the reverse injection of the holes into the emitter is suppressed even when the hole concentration in the SiGe base layer 4 is increased, which provides a sufficient current gain. As a result, there can be implemented a HBT which is low in base resistance and extremely high in maximum oscillation frequency fmax.

The potential barrier height enhanced by the δ-doped Si layer 11 is varied. by a carrier concentration in the δ-doped Si layer 11, a carrier concentration in a region of the Si emitter layer 5 on the periphery of the δ-doped Si layer 11, and an impurity profile in the δ-doped Si layer 11.

Figure 11:
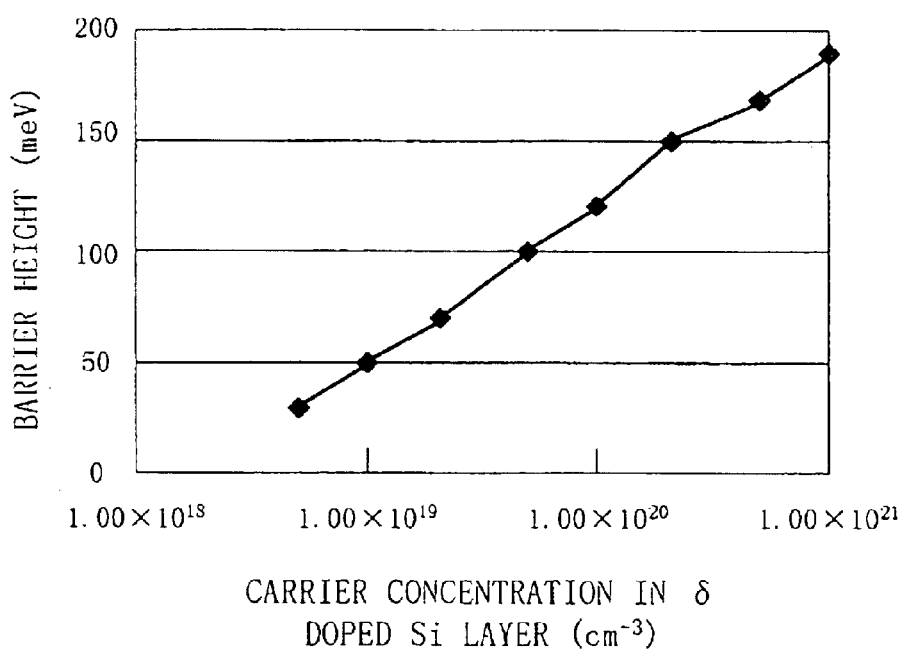
FIG. 11 shows the relationship between a carrier concentration and an increase in effective barrier height in the δ-doped Si layer.

FIG. 11 is a graph showing variations in barrier height plotted against the carrier concentration in the δ-doped Si layer (which is the concentration of an n-type impurity in the present embodiment but is the concentration of a p-type impurity in a PNP heterojunction bipolar transistor). It is to be noted that FIG. 11 is a graph obtained when the carrier concentration in the Si emitter layer is $1\times10^{18}$ cm$^{-3}$. In the present embodiment, the carrier concentration in the Si emitter layer 5 is $2\times10^{18}$ cm$^{-3}$, while the carrier concentration in the δ-doped Si layer 11 is $1\times10^{20}$ cm$^{-3}$, so that the carrier concentration ratio therebetween is 1:50. Thus, the δ-doped Si layer 11 according to the present embodiment has enhanced the barrier height by approximately 100 meV, which corresponds to a barrier height when the carrier concentration in the δ-doped Si layer 11 is $5\times10^{19}$ cm$^{-3}$ in FIG. 11.

For the effect of the present invention to be exerted more effectively, the carrier concentration in the δ-doped Si layer 11 is preferably $1\times10^{19}$ cm$^{-3}$ or higher. In addition, the increment of the barrier height caused by the δ-doped Si layer 11 is preferably by a factor of 10 or more. It will be understood that the barrier height is higher by 50 meV when the carrier concentration in the δ-doped Si layer 11 is ten times as high as the carrier concentration in the Si emitter layer 5. Hence, the carrier concentration in the δ-doped Si layer 11 is preferably more than ten times higher than the carrier concentration in the Si emitter layer 5.

By adjusting the carrier concentration in the SiGe base layer 4 to be higher than the carrier concentration in the Si emitter layer 5, it is also possible to desirably reduce the base resistance and suppress a capacitance increase at the PN junction portion.

Figure 12:
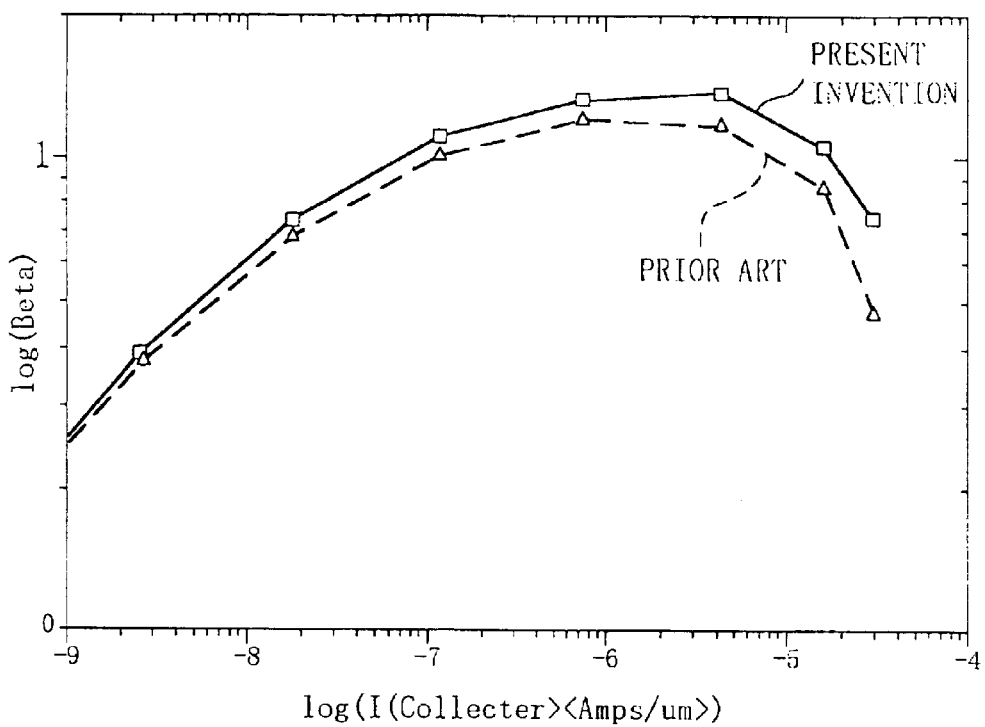
FIG. 12 shows the relationship between a current amplification factor β and a collector current in the NPN heterojunction bipolar transistor in each of the cases where the δ-doped Si layer is provided and not provided in the emitter layer.

FIG. 12 is a view showing the relationship (represented by the solid curve) between the current amplification factor β and a collector current in the NPN heterojunction bipolar transistor in which the δ-doped Si layer 11 is provided in the emitter layer according to the present embodiment and the relationship (represented by the dashed curve) between the current amplification factor β and a collector current in the conventional NPN heterojunction bipolar transistor in which the δ-doped Si layer is not provided in the emitter layer. As shown in the drawing, the current amplification factor β has been improved in the present embodiment with the provision of the δ-doped Si layer 11 in the Si emitter layer 5. The difference in current amplification factor β between the two heterojunction bipolar transistors is particularly conspicuous in a region with a large collector current. Since a high current amplification factor β is obtained in the heterojunction bipolar transistor according to the present embodiment even with such a large collector current, the maximum value $f_{Tmax}$ of the current cutoff frequency is increased by about 25% compared with the maximum value $f_{Tmax}$ in the heterojunction bipolar transistor without a δ-doped Si layer.

If the Ge composition ratio in the SiGe base layer 4 is increased, a dislocation may occur depending on the critical film thickness of SiGe. The respective critical film thicknesses for $Si_{0.8}Ge_{0.2}$, $Si_{0.7}Ge_{0.3}$, and $Si_{0.6}Ge_{0.4}$ when the underlie is Si are approximately 180 nm, 56 nm, and 25 nm.

In increasing the critical film thickness, it is effective to use $Si_{1-x-y}Ge_xC_y$ to compose the base layer. By adjusting the Ge composition to 40% or more and adding a slight amount of C (on the order of several percentage) thereto, a strained lattice can be alleviated without greatly varying the magnitude of the band discontinuity value ΔEv of the emitter/base junction, which increases the critical film thickness of the base layer. By thus composing the base layer of $Si_{1-x-y}Ge_xC_y$, a larger band discontinuity value ΔEv can be obtained without exceeding the critical film thickness.

Next, the δ-doped Si layer 11 is provided in the Si emitter layer 5 to enhance the effective barrier height. As shown in FIG. 9, the effect of improving the RF characteristics of the HBT having the SiGe graded composition base layer 4 is the same as illustrated in the first embodiment with reference to FIGS. 5 and 6.

From the foregoing, there have been derived the following effects that can be achieved by the heterojunction bipolar transistor (HBT) according to the present embodiment.

First, the provision of the δ-doped Si layer 11 for effectively enhancing the barrier height in the Si emitter layer achieves the same effect as achieved when the band discontinuity value ΔEv of the valence band at the emitter/base junction is substantially increased (see the equation (2)), resulting in an improved current amplification factor β. In other words, the provision of the δ-doped Si layer 11 for suppressing reverse injection of holes from the SiGe base layer 4 into the Si emitter layer 5 reduces the current Jp shown in the equation (2) flowing from the base to the emitter and thereby improves the current amplification factor β. The effect is achievable whether the emitter/base junction is a heterojunction or not. Consequently the same effect can also be achieved in a normal bipolar transistor other than a HBT.

Second, since the graded composition has been imparted to the SiGe base layer 4 and the δ-doped Si layer 11 is provided in the Si emitter layer 5, the Ge composition ratio in the SiGe base layer 4 varies such that the band gap in the SiGe base layer 4 gradually decreases from the region of the SiGe base layer 4 in contact with the Si emitter layer 5 toward the region thereof in contact with the Si collector layer 3, whereby the current gain cutoff frequency $f_T$ is increased. As stated previously, if the base doping concentration is increased to lower the resistance of the uniform composition base layer in the conventional HBT, the quantity of holes reversely injected is increased so that a sufficient current gain is not obtained. By contrast, since the effective barrier height at the heterojunction portion is increased with the provision of the δ-doped Si layer 11 in the HBT according to the present invention, the effective barrier height is held sufficiently large even when the band discontinuity value of the heterojunction at the emitter/base junction is reduced with the provision of the SiGe graded composition base layer 4 and the base doping concentration is increased, which suppresses reverse injection of holes. Hence, there can be obtained the heavily doped base layer having a graded composition, which has conventionally been unobtainable. As a result, the base transit time of electrons is reduced and the RF characteristics are improved.

Third, since the base transit time is reduced by providing the graded composition base layer, the thickness of the base layer can be increased. As a result, the base resistance is reduced and the maximum oscillation frequency fmax is increased.

Fourth, the fact that a sufficient current gain can be obtained even when the Ge composition ratio is low indicates that a dislocation caused by a thermal budget during the subsequent process step, which presents a problem when a high Ge composition ratio is used, can be suppressed. In the conventional HBT using the uniform composition base, it is required in doping the SiGe base layer with a high-concentration impurity to increase the Ge composition ratio in the SiGe base layer, so that the difference in lattice constant between the emitter layer and the Si base layer is increased disadvantageously to reduce the critical film thickness at which a dislocation is caused by the difference in lattice constant. However, if the effective barrier height is enhanced with the provision of the δ-doped Si layer 11, as in the present embodiment, satisfactory RF characteristics are achieved without increasing the Ge composition ratio in the SiGe base layer 4. The sufficient current gain obtainable with a low Ge composition ratio also achieves the effect of suppressing the occurrence of a dislocation due to the thermal budget during the subsequent process step, which presents a problem when a high Ge composition ratio is used, i.e., the effect of increasing the thermal budget. Briefly, this achieves the effect of providing the device fabrication process with an increased margin as well as increased device reliability.

Fifth, the temperature characteristic of the bipolar transistor can also be improved. Specifically, since the distribution of hole concentrations in the valence band of the SiGe layer 4 shifts downwardly at an increased temperature, the current amplification factor β of the bipolar transistor exhibits a tendency to lower as the temperature T increases. The tendency is particularly conspicuous when the band discontinuity value ΔEv is low. By contrast, the bipolar transistor according to the present invention provides a high current amplification factor β even at a high temperature owing to the function of suppressing reverse injection of holes performed by the δ-doped Si layer 11, as represented by the line 3 in FIG. 7(b).

Thus, by providing the δ-doped Si layer 11 in the region of the emitter layer 5 adjacent the emitter/base junction of the heterojunction bipolar transistor, the current gain and RF characteristics of the heterojunction bipolar transistor can be improved.

For the δ-doped Si layer 11 to reliably perform the barrier function, the whole δ-doped Si layer 11 is preferably disposed externally of a depletion region formed between the emitter and the base at a working voltage and the δ-doped Si layer 11 is preferably adjacent to the depletion region. This is because, if the δ-doped Si layer 11 has a part located within the depletion region, the barrier height is reduced and the function of suppressing reverse injection of holes may be degraded. Preferably, the δ-doped Si layer 11 in the Si emitter layer 5 is at a distance shorter than the diffusion length of hole from the SiGe base layer 4.

Although the present embodiment has described the improved characteristics of the heterojunction bipolar transistor as a single element, it will easily be appreciated that the HBT according to the present invention may also be used for the bipolar part of a BiCMOS device in which the bipolar transistor and a MOS transistor have been integrated.

Although the present embodiment has described the NPN SiGe HBT by way of example, it will easily be appreciated that the present invention is also applicable to a PNP bipolar transistor. Alternatively, the present invention may also be applied to a normal homojunction bipolar transistor other than the HBT and to a heterojunction bipolar transistor having a multi-level structure consisting of III-V compound semiconductor layers of GaAs, AlGaAs, and the like, as stated previously.

EMBODIMENT 3

Figure 13:
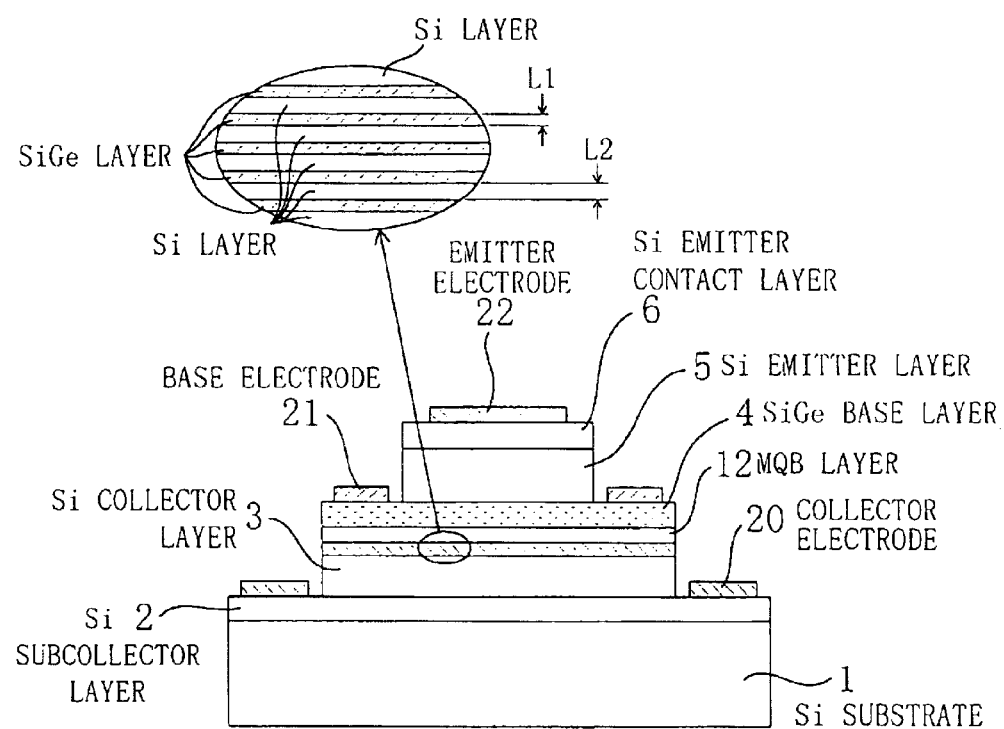
FIG. 13 is a cross-sectional view of an NPN heterojunction bipolar transistor according to a third embodiment, in which a MQB layer as a Si/SiGe multi-quantum barrier portion is provided in the collector layer.

FIG. 13 is a cross-sectional view showing a structure of an NPN heterojunction bipolar transistor having a multi-quantum barrier composed of a Si/SiGe superlattice provided in the collector layer according to the present embodiment. As shown in the drawing, there are provided; a high-concentration n-type Si subcollector layer 2 doped with arsenic; an n-type Si collector layer 3 doped with arsenic; a high-concentration p-type SiGe base layer 4 doped with boron; an n-type Si emitter layer 5 doped with arsenic; and a high-concentration n-type Si emitter contact layer 6 doped with arsenic that have been stacked sequentially on a Si substrate 1. A collector electrode 20, a base electrode 21, and an emitter electrode 22 are disposed on the Si subcollector layer 2, the SiGe base layer 4, and the Si emitter contact layer 6, respectively.

The thickness of the high-concentration n-type Si subcollector layer 2 is approximately 500 nm and the concentration of arsenic (n-type impurity) in the Si subcollector 2 is approximately $2 \times 10^{19}$ cm$^{-3}$. The thickness of the n-type Si collector layer 3 is approximately 650 nm and the concentration of the Si collector layer 3 is approximately $1 \times 10^{17}$ cm$^{-3}$. The thickness of the high-concentration p-type SiGe base layer 4 is approximately 50 nm and the concentration of boron (p-type impurity) in the SiGe base layer 4 is approximately $1 \times 10^{19}$ cm$^{-3}$. The thickness of the n-type Si emitter layer 5 is approximately 100 nm and the concentration of arsenic in the Si emitter layer 5 is approximately $2 \times 10^{18}$ cm$^{-3}$. The thickness of the high-concentration n-type Si emitter contact layer 6 is approximately 50 nm and the concentration of arsenic in the Si emitter contact layer 6 is approximately $2 \times 10^{19}$ cm$^{-3}$. These layers have been stacked sequentially by MBE.

A MQB layer 12 as a multi-quantum barrier portion having a superlattice structure composed of extremely thin Si and SiGe that have been alternately stacked is provided in a region of the Si collector layer 3 adjacent the collector/base junction portion. The MQB layer 12 has such a structure that the compositions and film thicknesses thereof have been adjusted to reflect an incident wave of holes injected from the SiGe base layer 4 into the Si collector layer 3 and provide a phase in which the incident wave and a reflected wave intensify each other. Specifically, the MQB layer 12 has a multilayer structure consisting of well layers 12a each composed of a SiGe layer with a thickness of L1 and barrier layers 12b each composed of a Si layer with a thickness of L2. The respective thicknesses and compositions of the well layers 12a and the barrier layers 12b are determined to satisfy the relationship represented by the following equation (3), similarly to the first embodiment.

$$\left.\begin{array}{l} \frac{\sqrt{2m_1 * E}}{h} \cdot L_1 = \frac{2m-1}{4} \\ \frac{\sqrt{2m_2 * (E - \Delta Ev)}}{h} \cdot L_2 = \frac{2n-1}{4} \end{array}\right\} \quad (3)$$

m1*: effective mass of holes in SiGe layer (well layer)
m2*: effective mass of holes in Si layer (barrier layer)
L1: thickness of SiGe layer (well layer)
L2: thickness of Si layer (barrier layer)
E: energy of incident holes
$\Delta Ev$: valence band discontinuity value at Si/SiGe heterojunction
h: Planck's constant
m, n: integers Specifically, the MQB layer 12 according to the present embodiment is composed of a superlattice layer constructed of five pairs of the barrier layers 12b each formed of Si having a thickness of 1.5 nm and the well layers 12a each formed of Si$_{0.8}$Ge$_{0.2}$ having a thickness of 1.5 nm. In this case, an effective barrier height enhanced by the MQB layer 12 is approximately 130 meV.

On the other hand, the SiGe base layer 4 has a graded composition base structure in which a Ge composition ratio increases substantially continually from 0% to 20% from a region in contact with the Si emitter layer 5 toward a region in contact with the Si collector layer 3. Accordingly, the barrier height sensed by holes in the SiGe layer 4 is 280 meV, which is the sum of 150 meV corresponding to the amount of valence band offset occurring at the base/collector heterojunction composed of Si/Si$_{0.8}$Ge$_{0.2}$ and 130 meV corresponding to the effectively enhanced barrier height of the MQB layer 12. This achieves a sufficient reduction in the minority carriers injected from the SiGe base layer 4 and accumulated in the Si collector layer 4.

Figure 14:
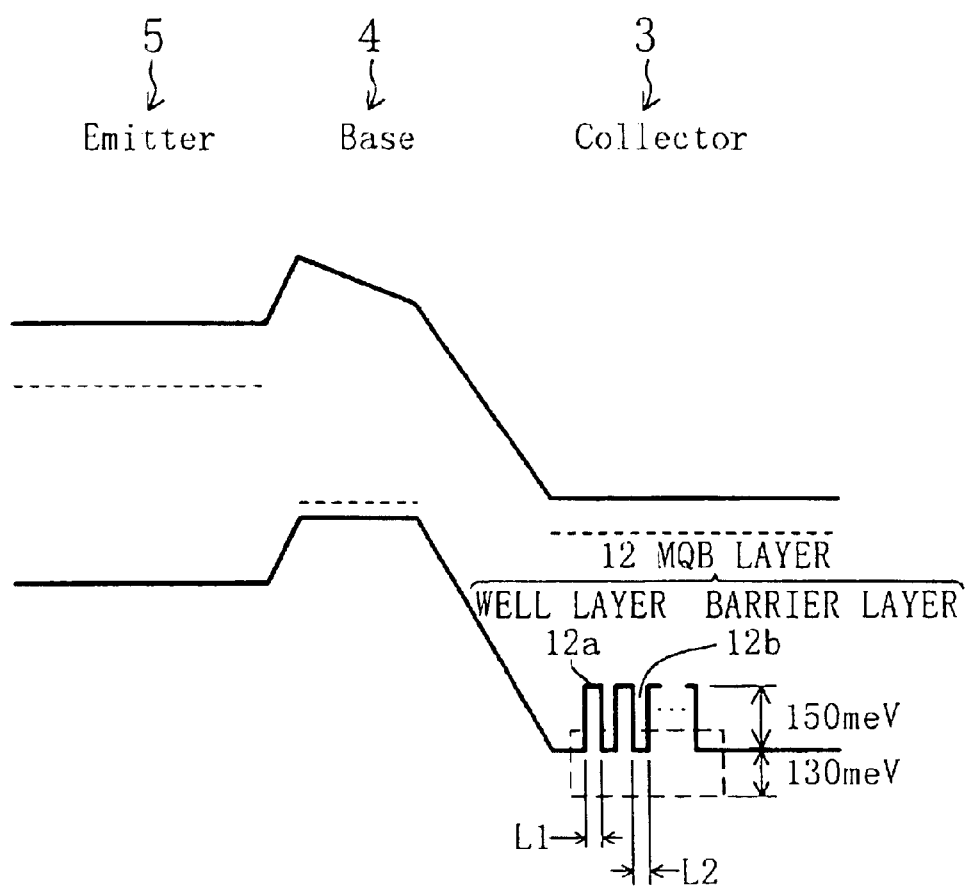
FIG. 14 is a band diagram of the NPN hetero bipolar transistor according to the third embodiment, in which the MQB layer is provided in the collector layer.

FIG. 14 is a band diagram of the NPN heterojunction bipolar transistor having the multi-quantum barrier layer composed of the Si/SiGe superlattice and provided in the Si collector layer 3 according to the present embodiment. As shown in the drawing, the multi-quantum barrier layer consisting of the five pairs of Si barrier layers 12b and Si$_{0.8}$Ge$_{0.2}$ well layers 12a is provided in a region of the Si collector layer 3 adjacent the collector/base junction. A potential barrier indicated by the broken lines in FIG. 14 is formed due to the existence of the MQB layer 12. The potential barrier operates to reflect holes likely to flow from the SiGe base layer 4 into the Si collector layer 3, which has enhanced an effective height sensed by the holes likely to flow from the SiGe base layer 4 by approximately 130 meV. The enhanced effective barrier height suppresses injection of the holes into the Si collector layer 3 so that the quantity of minority carriers accumulated in the Si collector layer 3 is reduced and the operating speed is increased.

The model for calculating the barrier height $\Delta Ue$ enhanced by the MQB layer 12 provided in the collector is similar to the model for calculating the barrier height $\Delta Ue$ in the case where the MQB layer is provided in the emitter according to the first embodiment, which is shown in FIG. 3. Specifically, the respective band discontinuity values $\Delta Ev$ of the valence bands at the individual heterojunctions between the well layers 12a and the barrier layers 12b that have been calculated for the three structures of Si/Si$_{0.8}$Ge$_{0.2}$, Si/Si$_{0.7}$Ge$_{0.3}$, and Si/Si$_{0.6}$Ge$_{0.4}$ are 150 meV, 225 meV, and 300 meV. It is to be noted that, since each of the well layers 12a and barrier layers 12b has a thickness of 1.5 nm in the present embodiment, the values obtained in the present embodiment are different from the values of the corresponding parts shown in FIG. 3.

The result of calculating the barrier heights $\Delta Ue$ enhanced by the MQB layer 12 in response to variations in the number of the atomic monolayers of well layers 12a and barrier layers 12b is also as shown in FIG. 4.

In order to enhance the barrier height $\Delta Ue$ when SiGe is used in the well layer 12a of the MQB layer 12, it is also necessary in the present embodiment to further increase the Ge composition ratio in the well layers 12a, similarly to the first embodiment. However, the increased Ge composition ratio may cause a dislocation depending on the critical film thickness of SiGe. The respective critical film thicknesses for Si$_{0.8}$Ge$_{0.2}$, Si$_{0.7}$Ge$_{0.3}$, and Si$_{0.6}$Ge$_{0.4}$ when the underlie is Si are approximately 180 nm, 56 nm, and 25 nm.

In increasing the critical film thickness, it is effective to use Si$_{l-x-y}$Ge$_x$C$_y$ and Si to compose the well layers 12a and barrier layers 12b of the MQB layer 12, respectively. By adjusting the Ge composition to 40% or more and adding a slight amount of C (on the order of several percentage) thereto, a strained lattice can be alleviated without greatly varying the magnitude of the band discontinuity value $\Delta Ev$ at the collector/base junction, which increases the critical film thickness of the well layer 12a. By thus composing the MQB layer 12a of Si$_{l-x-y}$Ge$_x$C$_y$, a larger band discontinuity value $\Delta Ev$ can be obtained without exceeding the critical film thickness, which effectively suppresses injection of holes from the SiGe base layer 4 into the Si collector layer 3.

By thus providing the MQB layer 12 in the region of the Si collector layer 3 adjacent the base/collector junction of the heterojunction bipolar transistor, it becomes possible to effectively enhance the height of the heterojunction barrier at the base/collector heterojunction and thereby suppress injection of minority carriers from the SiGe base layer 4 into the Si collector layer 3. As a result, the quantity of minority carriers accumulated in the Si collector layer 3 is reduced and the operating speed of the bipolar transistor can be increased.

Although the present embodiment has described the improved characteristics of the heterojunction bipolar transistor as a single element, it will easily be appreciated that the HBT according to the present invention may also be used for the bipolar part of a BiCMOS device in which the bipolar transistor and a MOS transistor have been integrated.

It will easily be appreciated that, if an integrated circuit uses as a component the base/collector PN junction of a heterojunction bipolar transistor having a multi-quantum barrier against minority carriers provided in a collector, as shown in the present embodiment, the speed of the integrated circuit is increased.

EMBODIMENT 4

Figure 15:
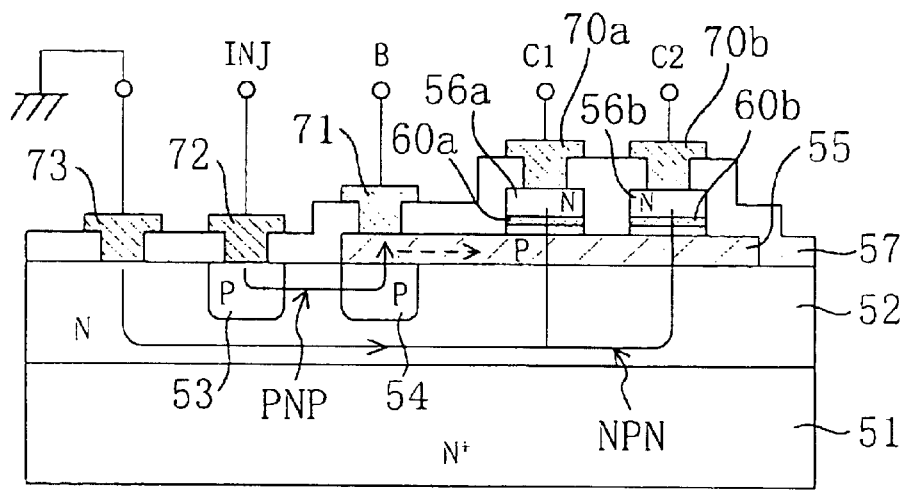
FIG. 15 is a cross-sectional view showing a structure of an I²L element according to a fourth embodiment, in which a MQB layer is provided in each of two collector layers.
Figure 16:
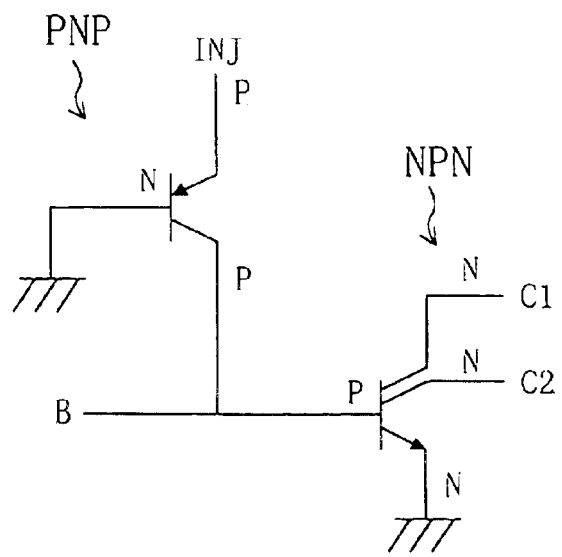
FIG. 16 is an electric circuit diagram showing a circuit equivalent to the I²L element according to the fourth embodiment.

FIG. 15 is a cross-sectional view of an I²L element comprising a Si/SiGe heterojunction bipolar transistor having a MQB layer provided in a collector layer as shown in the third embodiment. FIG. 16 is an electric circuit diagram showing a circuit equivalent to the I²L element.

A description will be given below to a structure of the I²L element shown in FIG. 15 with reference to FIG. 16. The I²L element according to the present embodiment comprises: an n⁺-type semiconductor region 51; an n-type Si common diffusion layer 52 disposed on the semiconductor region 51 to function as the base layer of a PNP bipolar transistor and as the emitter layer of an NPN bipolar transistor; a Si emitter layer 53 and a Si collector 54 of the PNP bipolar transistor formed by introducing a p-type impurity into the Si common diffusion layer 52; a p-type SiGe base layer 55 of the I²L element disposed on the Si common diffusion layer 52; two n-type Si collector layers 56a and 56b of the NPN bipolar transistor disposed on the SiGe base layer 55; an insulating layer 57 covering the entire substrate; two collector electrodes 70a and 70b of the NPN bipolar transistor for contact with the Si collector layers 56a and 56b through the insulating layer 57; a base electrode 71 of the I²L element for contact with the SiGe base layer 55 through the insulating layer 57; an injection electrode 72 of the I²L element for contact with the Si emitter layer 53 of the PNP bipolar transistor through the insulating layer 57; and a ground electrode 73 for contact with the Si common diffusion layer 52 through the insulating layer 57. It is to be noted that the SiGe base layer 55 of the I²L element functions as the base layer of the NPN bipolar transistor and as the collector contact layer of the PNP bipolar transistor. The I²L element is structured such that a current for driving the PNP transistor is injected into the injection electrode 72, an input signal to the I²L element is inputted to the base electrode 71, and an output signal from the I²L element is obtained from each of the collector electrodes 70a and 70b connected to a power source voltage via a circuit (not shown). The arrows shown in FIG. 15 represent respective current flows in the PNP and NPN bipolar transistors.

The concentration of arsenic (n-type impurity) in each of the Si collector layers 56a and 56b is approximately $1 \times 10^{17}$ cm⁻³. In a surface region of each of the Si collector layers 56a and 56b, there is provided a contact layer doped with arsenic at a high concentration (approximately $1 \times 10^{20}$ cm⁻³), though it is not shown. The concentration of boron (p-type impurity) in the SiGe base layer 55 is approximately $2 \times 10^{18}$ cm⁻³. The concentration of boron in the Si emitter layer 53 is approximately $1 \times 10^{19}$ cm⁻³. The concentration of boron in the Si collector layer 54 is approximately $1 \times 10^{19}$ cm⁻³. The concentration of phosphorus in the Si common diffusion layer 52 is approximately $1 \times 10^{18}$ cm⁻³.

The following is the operation of the I²L element. When a low-voltage signal "L" is inputted to the base electrode 71, the current flow in the PNP bipolar transistor becomes as indicated by the solid arrow in the drawing, so that the base voltage of the NPN bipolar transistor is lowered to turn OFF the NPN bipolar transistor. Accordingly, the voltage at each of the collector electrodes 70a and 70b connected to the power-source voltage becomes high so that a signal "H" is outputted. When the high-voltage signal "H" is inputted to the base electrode 71, on the other hand, the current flow in the PNP bipolar transistor becomes as indicated by the dashed arrow so that the base voltage of the NPN bipolar transistor becomes high to turn ON the NPN transistor. As a result, the voltage at each of the collector electrodes 70a and 80b becomes low so that the signal "L" is outputted. In short, the I²L element functions as a NOT circuit (inverter).

The I²L element according to the present embodiment is characterized in that the same MQB layers 60a and 60b as formed in the first embodiment are formed in the two Si collector layers 56a and 56b, respectively.

Such an I²L element performs the same function as performed by an inverter composed of the PFET and NFET of a CMOS device. Since the I²L element does not require an isolation film as required by the CMOS device, it has the advantage of suitability for higher integration. However, a conventional I²L element has the drawback of an elongated time required for ON/OFF switching due to minority carriers accumulated in the collector layer of the NPN bipolar transistor. For this reason, the I²L element is not frequently used in a semiconductor integrated circuit.

By contrast, since the structure of the I²L element according to the present embodiment has the MOB layers 60a and 60b provided in the Si collector layers 56a and 56b, respectively, for preventing injection of holes from the base, it is free from the elongated ON/OFF switching time due to holes (minority carriers) accumulated in the Si collector layers 56a and 56b and performs a high-speed operation intrinsic to a bipolar transistor. Hence, the I²L element has the advantages of suitability for higher integration and a high-speed operating property, which allows the use of the I²L element as an inverter in a Si heterojunction device. In addition, power consumption is satisfactorily low compared with the power consumption of a MOS device.

The I²L element according to the present embodiment further has the following structural advantages. In contrast to a CMOS device, the NPN bipolar transistor on the output side of the I²L element has a so-called collector top structure in which the Si collector layers 56a and 56b are disposed above the SiGe base layer 55. The collector top structure is suitable for the provision of the MQB layers 60a and 60b formed by epitaxial growth. More specifically, the I²L element has the collector top structure in which the collector layer is formed above the base layer because of a plurality of collector outputs, while a normal Si/SiGe HBT generally has an emitter top structure in which an emitter layer is formed above a SiGe base layer formed by epitaxial growth. This is because, in the I²L element, the emitter and base regions of the NPN bipolar transistor also serve as the base and collector regions of the PNP bipolar transistor as a constant current source, so that the base and collector layers of the NPN transistor are eventually formed by epitaxial growth above the emitter layer.

From this viewpoint, it can also be said that the I²L element having the MQB layers provided in a region of the collector adjacent the base/collector junction portion of the HBT has an easy-to-fabricate structure.

Although the present embodiment has described the I²L element using the NPN SiGe HBT, it is also possible to compose the I²L element by using a PNP SiGe HBT.

The I²L element according to the present embodiment may be a heterojunction bipolar transistor having a multi-level structure consisting of III-V compound semiconductor layers of GaAs, AlGaAs, and the like.

Although the present embodiment has the two collector layers, it may also have a single collector layer or three or more collector layers.

EMBODIMENT 5

A description will be given below to a semiconductor device according to a third embodiment, in which the base/collector junction portion of a bipolar transistor can be used as a diode.

Figure 17:
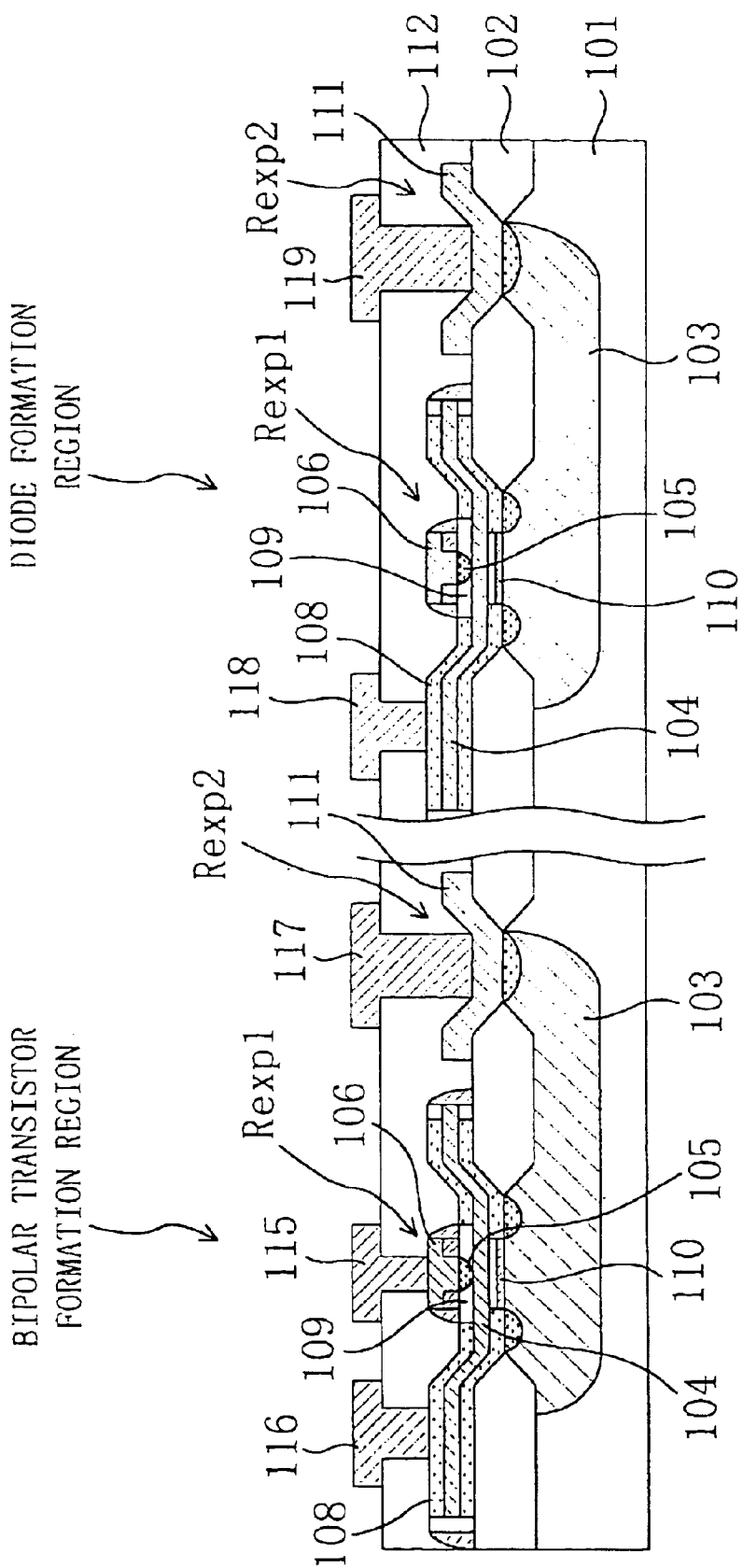
FIG. 17 is a cross-sectional view of a semiconductor device having a bipolar transistor in which a MQB layer is provided in the collector layer and a diode composed by using only the base and collector of the bipolar transistor.
Figure 18:
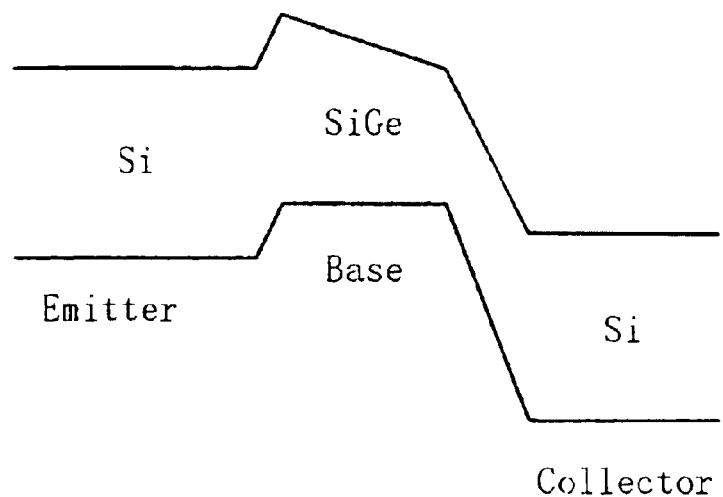
FIG. 18 is a cross-sectional view of the conventional SiGe NPN heterojunction bipolar transistor using the graded composition base layer.
Figure 19:
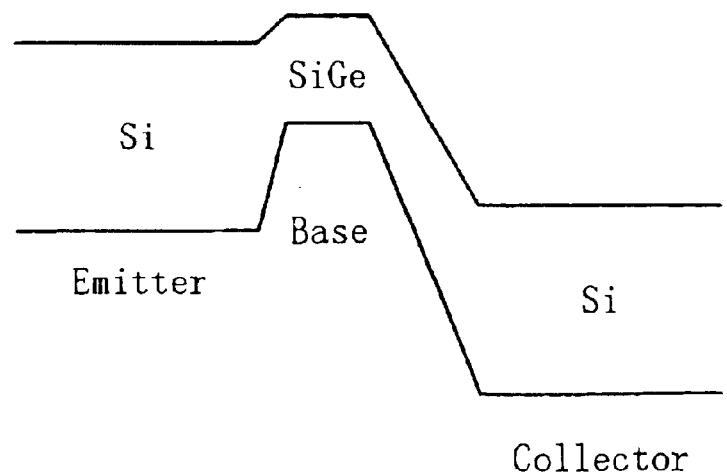
FIG. 19 is a band diagram of the conventional SiGe NPN heterojunction bipolar transistor using the uniform composition base layer.

As shown in FIG. 17, the semiconductor device according to the present embodiment has a bipolar transistor formation region and a diode formation region. The bipolar transistor formation region and the diode formation region have common members, except for electrodes, which are formed by common process steps. Specifically, there are provided: a Si collector layer 103; a p-type SiGe base layer 104 formed on the Si collector layer 103; an n⁺-type Si emitter layer 105 formed on the SiGe base layer 104; an emitter withdrawn electrode 106 composed of polysilicon for contact with the Si emitter layer 105; and a MQB layer 110 formed on a region of the Si collector layer 103 underlying a first exposed region Rexp1, each of which is located in an active region composed of the first and second exposure regions Rexp1 and Rexp2 of the Si substrate 101 surrounded by LOCOS films 102 and of the internal region of the substrate interposed between the exposed regions Rexp1 and Rexp2. A first Si single-crystal film including the Si collector layer 103 is formed by epitaxial growth over the first exposed region Rexp1 and the surrounding LOCOS films, which is thoroughly provided with a superlattice multi-layer structure common to the MQB layer 110. A p-type impurity has been introduced into the first Si single-crystal film except for the region thereof immediately under the emitter withdrawn electrode 106 by ion implantation using the emitter withdrawn electrode 106 as a mask. The SiGe base layer 104 is formed over the first Si single-crystal film and a second Si single-crystal film is further formed by epitaxial growth over the SiGe base layer 104. The second Si single-crystal film except for the region thereof immediately under the emitter withdrawn electrode 106 forms a silicide layer 108, while the region immediately under the emitter withdrawn electrode 106 forms a Si cap layer 109. The foregoing Si emitter layer 105 has been formed by introducing, by diffusion, a high-concentration n-type impurity into the Si cap layer 109 from the emitter withdrawn electrode 106. A collector withdrawn electrode 111 composed of polysilicon for contact with the Si collector layer 103 is formed over the second exposed region Rexp2 and the surrounding LOCOS films 102. An insulating film 112 composed of a silicon oxide film is formed on the substrate.

The concentration of arsenic (n-type impurity) in the Si collector layer 103 is approximately $1 \times 10^{17}$ cm$^{-3}$. The thickness of the SiGe base layer 104 is approximately 50 nm and the concentration of boron (p-type impurity) in the SiGe base layer 104 is approximately $1 \times 10^{19}$ cm$^{-3}$. The thickness of the Si cap layer 109 is approximately 100 nm and the concentration of arsenic in the Si emitter layer 105 of the Si cap layer 109 is approximately $2 \times 10^{18}$ cm$^{-3}$.

The present embodiment is characterized in that the diode has no electrode equivalent to the emitter electrode, while the NPN bipolar transistor has an Al emitter electrode 115 connected to the emitter withdrawn electrode 106, an Al base electrode 116 connected to the silicide layer provided on the Si base layer 104, and an Al collector electrode 117, each of which is formed on the insulating layer 112. Briefly, only the Al anode 118 equivalent to the base electrode 116 of the NPN bipolar transistor and the Al cathode 119 equivalent to the collector electrode of the NPN bipolar transistor are provided. Thus, the diode according to the present embodiment has only the anode and the cathode connected to the base and to the collector, respectively, without an electrode connected to the emitter, while having the same emitter, base, and collector structures as the NPN bipolar transistor.

The semiconductor device according to the present embodiment comprises the diode having a heterojunction in addition to the heterojunction bipolar transistor exerting the same effect as exerted in the third embodiment. In the diode also, there is provided a MQB layer in a region of the Si collector layer 103 connected to the cathode electrode 119 adjacent the junction portion between the Si collector layer 103 and the SiGe base layer 104, so that the operating speed is increased by suppressing the accumulation of holes.

Although the present embodiment has described the NPN SiGe HBT by way of example, it will easily be appreciated that the present invention is also applicable to the PNP bipolar transistor. As stated previously, the present invention is also applicable to a normal homojunction bipolar transistor other than a HBT or to a heterojunction bipolar transistor having a multi-layer structure consisting of III-V compound semiconductor layers of GaAs, AlGaAs, and the like.

What is claimed is:

1. A bipolar transistor comprising an emitter layer containing an impurity of a first conductivity type, a base layer containing an impurity of a second conductivity type, and a collector layer containing the impurity of the first conductivity type, said bipolar transistor having:

a high-concentration doped layer being provided in said emitter layer and doped with the impurity of the first conductivity type at a higher concentration than in said emitter layer, wherein a composition of a material composing said emitter layer is the same as that of a material composing said high-concentration doped layer, said high-concentration doped layer is a barrier layer from the viewpoint of holes in said base layer, a Ge composition ratio in said base layer increases from a region in contact with the emitter layer toward a region in contact with the collector layer, and thereby said base layer has a portion with a band gap gradually decreasing from a region of said base layer in contact with the emitter layer toward a region of said base layer in contact with the collector layer, said emitter layer has at least two semiconductor layers, and said high-concentration doped layer is interposed between said at least two semiconductor layers.

2. The bipolar transistor according to claim 1, wherein said high-concentration doped layer is a δ-doped layer having a thickness of 10 nm or less.

3. The bipolar transistor according to claim 1, wherein the concentration of carriers of the first conductivity type in said high-concentration doped layer is $1 \times 10^{19}$ cm$^{-3}$ or more.

4. The bipolar transistor according to claim 1, wherein the concentration of carriers of the first conductivity type in said high-concentration doped layer is more than ten times higher than the concentration of the carriers of the first conductivity type in said emitter layer.

5. The bipolar transistor according to claim 1, wherein said high-concentration doped layer is adjacent to a depletion region formed at an emitter/base junction portion.

6. The bipolar transistor according to claim 1, wherein the concentration of carriers of the second conductivity type in said base layer is higher than the concentration of carriers of the first conductivity type in said emitter layer.

7. The bipolar transistor according to claim 1, wherein said emitter layer and said base layer are composed of two types of semiconductor materials having different band gaps and the semiconductor material composing the emitter layer has the wider band gap, said bipolar transistor having a heterojunction portion between said emitter layer and said base layer.

8. The bipolar transistor according to claim 7, wherein said base layer is strained.

9. The bipolar transistor according to claim 7, wherein said base layer is composed of a semiconductor containing at least silicon and germanium.

10. The bipolar transistor of claim 1, wherein the distance between said high-concentration doped layer and said base layer is 40 nm or less.

* * * * *

UNITED STATES PATENT AND TRADEMARK OFFICE
CERTIFICATE OF CORRECTION

PATENT NO. : 6,737,684 B1
DATED : May 18, 2004
INVENTOR(S) : Takeshi Takagi and Kenji Harafuji It is certified that error appears in the above-identified patent and that said Letters Patent is hereby corrected as shown below:

Title page,
Item [56], References Cited, U.S. PATENT DOCUMENTS, please delete "5,246,316 A 9/1993 Mohammad"

Signed and Sealed this

Fourteenth Day of December, 2004

JON W. DUDAS
*Director of the United States Patent and Trademark Office*